US012791938B2

(12) United States Patent
Chen et al.

(10) Patent No.: US 12,791,938 B2
(45) Date of Patent: Nov. 10, 2026

(54) QUANTUM DOT MIXTURE, QUANTUM DOT LIGHT EMITTING LAYER AND PREPARATION METHOD THEREOF

(71) Applicants: Beijing BOE Technology Development Co., Ltd., Beijing (CN); BOE Technology Group Co., Ltd., Beijing (CN)

(72) Inventors: Zhuo Chen, Beijing (CN); Zhuo Li, Beijing (CN); Di Zhang, Beijing (CN); Xu Yuan, Beijing (CN)

(73) Assignee: BEIJING BOE TECHNOLOGY DEVELOPMENT CO. , LTD., Beijing (CN)

( * ) Notice: Subject to any disclaimer, the term of this patent is extended or adjusted under 35 U.S.C. 154(b) by 622 days.

(21) Appl. No.: 18/277,589

(22) PCT Filed: Mar. 18, 2022

(86) PCT No.: PCT/CN2022/081762

§ 371 (c)(1),
(2) Date: Aug. 17, 2023

(87) PCT Pub. No.: WO2023/173417

PCT Pub. Date: Sep. 21, 2023

(65) Prior Publication Data

US 2025/0013147 A1 Jan. 9, 2025

(51) Int. Cl.

| | |
|---|---|
| ***G03F 7/004*** | (2006.01) |
| ***B82Y 20/00*** | (2011.01) |
| ***B82Y 40/00*** | (2011.01) |
| ***C09K 11/02*** | (2006.01) |
| ***G03F 7/00*** | (2006.01) |
| ***G03F 7/30*** | (2006.01) |
| ***H10K 50/115*** | (2023.01) |
| ***H10K 71/20*** | (2023.01) |

(52) U.S. Cl.

CPC .......... *G03F 7/0045* (2013.01); *C09K 11/025* (2013.01); *G03F 7/0007* (2013.01); *G03F 7/30* (2013.01); *H10K 71/233* (2023.02); *B82Y 20/00* (2013.01); *B82Y 40/00* (2013.01); *H10K 50/115* (2023.02)

(58) Field of Classification Search

None

See application file for complete search history.

(56) References Cited

U.S. PATENT DOCUMENTS

| | | | | |
|---|---|---|---|---|
| 2016/0363814 | A1* | 12/2016 | Liu | G02F 1/133605 |
| 2018/0108842 | A1* | 4/2018 | Li | G03F 7/0007 |
| 2024/0244954 | A1* | 7/2024 | Chen | H10K 85/381 |

FOREIGN PATENT DOCUMENTS

| | | | |
|---|---|---|---|
| CN | 112271269 | A | 1/2021 |
| CN | 112410019 | A | 2/2021 |
| CN | 113046058 | A | 6/2021 |
| CN | 113755158 | A | 12/2021 |
| CN | 113903874 | A | 1/2022 |

OTHER PUBLICATIONS

International Search Report and Written Opinion mailed on Sep. 26, 2022, in corresponding PCT/CN2022/081762, 9 pages.

* cited by examiner

*Primary Examiner* — Anca Eoff
(74) *Attorney, Agent, or Firm* — XSENSUS LLP

(57) ABSTRACT

The disclosure provides a quantum dot mixture, a quantum dot light emitting layer and a preparation method thereof, relates to the field of display technology. The preparation method of quantum dot light emitting layer includes: providing a substrate; forming a quantum dot film layer on one side of the substrate, which comprises a first quantum dot body-first ligand and a second quantum dot body-second ligand; exposing a predetermined region of the substrate to form a cross-linkage or a salt insoluble in the developer via a reaction between the first ligand and the second ligand in the predetermined region of the quantum dot film layer; and developing to remove the quantum dot film layer in the non-predetermined region of the substrate, and obtain the quantum dot light emitting layer. The disclosure provides a basis for the formation of the quantum dot light emitting layer using photolithography technology.

18 Claims, 4 Drawing Sheets

QUANTUM DOT MIXTURE, QUANTUM DOT LIGHT EMITTING LAYER AND PREPARATION METHOD THEREOF

CROSS-REFERENCE TO RELATED APPLICATION

The present application is based on PCT filing PCT/CN2022/081762, filed Mar. 18, 2022, the entire contents of which are incorporated herein by reference.

TECHNICAL FIELD

The disclosure relates to the field of display technology, and in particular, to a quantum dot mixture, a quantum dot light emitting layer and a preparation method thereof.

BACKGROUND

With the in-depth development of quantum dot preparation technology, the stability and luminescent efficiency of quantum dots continue to improve. The research on Quantum Dot Light Emitting Diodes (QLED) continues to deepen, and the application prospects of QLED in the display field are becoming increasingly bright. However, the efficiency of QLED has not yet reached the level of mass production. One important reason is that QLED high-resolution patterning technology has not yet achieved a breakthrough.

The inorganic nanoparticle characteristics of quantum dots prevent them from being evaporated into films and patterned. And it is difficult to achieve high resolution through inkjet printing.

The above information disclosed in the background technology section is only used to enhance the understanding of the background of the disclosure, and therefore it may include information that does not constitute prior art known to ordinary technical person in the art.

SUMMARY

The object of the disclosure is to provide a quantum dot mixture, a quantum dot light emitting layer, and a preparation method thereof. The disclosure provides a basis for the formation of a quantum dot light emitting layer using photolithography technology.

To achieve the above invention objects, the following technical solutions are adopted in the disclosure.

According to the first aspect of the disclosure, a preparation method of quantum dot light emitting layer is provided, which includes: providing a substrate; forming a quantum dot film layer on one side of the substrate, which includes a first quantum dot body-first ligand and a second quantum dot body-second ligand; exposing a predetermined region of the substrate to form a cross-linkage or a salt insoluble in the developer via a reaction between the first ligand and the second ligand in the predetermined region of the quantum dot film layer; and developing to remove the quantum dot film layer in the non-predetermined region of the substrate, and obtain the quantum dot light emitting layer.

In an exemplary embodiment of the disclosure, the first quantum dot body-first ligand is soluble in the developer.

The second quantum dot body-second ligand is insoluble in the developer after being exposed.

The first ligand of the first quantum dot body-first ligand includes a cross-linkable group.

The second ligand of the second quantum dot body-second ligand includes Z group, the structure of the Z group is -A-B, where A is imino group, and B is a protective group.

Under light conditions, the Z group can remove the protective group to form amino group under the action of a photo-acid generator, and a cross-linkage or a salt insoluble in the developer is formed via a reaction between the formed amino group and the cross-linkable group.

In an exemplary embodiment of the disclosure, forming the quantum dot film layer on one side of the substrate, includes: providing a mixed solution of a first quantum dot body-first ligand solution, a second quantum dot body-second ligand solution, and the photo-acid generator; and applying the mixed solution of the first quantum dot body-first ligand solution, the second quantum dot body-second ligand solution, and the photo-acid generator on one side of the substrate to form the quantum dot film layer.

In an exemplary embodiment of the disclosure, forming the quantum dot film layer on one side of the substrate includes: forming at least one first quantum dot film layer and at least one second quantum dot film layer on one side of the substrate, the first quantum dot film layer and the second quantum dot film layer being stacked. The material of the first quantum dot film layer includes the first quantum dot body-first ligand, and the material of the second quantum dot film layer includes the second quantum dot body-second ligand.

In an exemplary embodiment of the disclosure, the first quantum dot body-first ligand is soluble in the developer.

The second quantum dot body-second ligand is insoluble in the developer after being exposed.

In an exemplary embodiment of the disclosure, forming at least one first quantum dot film layer and at least one second quantum dot film layer on one side of the substrate includes: providing a first quantum dot body-first ligand solution; applying the first quantum dot body-first ligand solution on one side of the substrate to form the first quantum dot film layer; providing a mixed solution of the second quantum dot body-second ligand solution and the photo-acid generator; and applying the mixed solution of the second quantum dot body-second ligand solution and the photo-acid generator on the side of the first quantum dot film layer far from the substrate to form the second quantum dot film layer.

In an exemplary embodiment of the disclosure, the cross-linkable group is selected from carboxylic acid group or sulfonic acid group.

In an exemplary embodiment of the disclosure, the protective group is selected from a group consisting of the following structures:

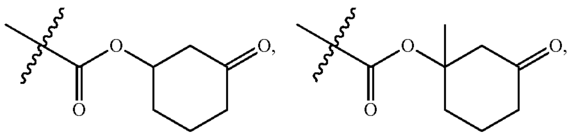

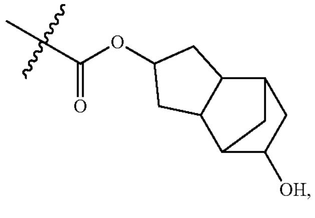

-continued

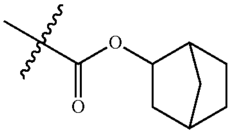

and

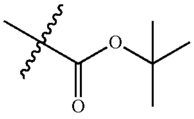

, wherein  represents a chemical bond.

In an exemplary embodiment of the disclosure, providing the first quantum dot body-first ligand solution, includes: providing a first quantum dot body-first ligand matrix solution; and adding an activator to the first quantum dot body-first ligand matrix solution, activating the first ligand matrix in the first quantum dot body-first ligand matrix solution to the first ligand, and obtain the first quantum dot body-first ligand solution. Wherein the first ligand matrix includes a cross-linkable matrix, which is selected from carboxylic acid group or sulfonic acid group. The cross-linkable group is selected from

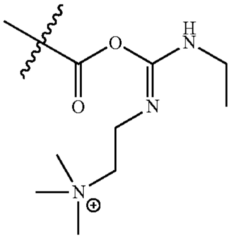

,

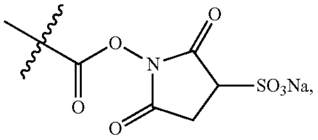

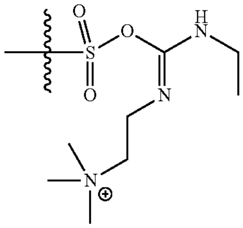

or

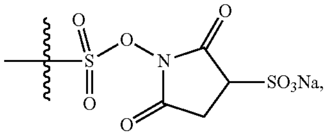

wherein  represents a chemical bond.

In an exemplary embodiment of the disclosure, the activator is selected from one or two of 1-ethyl-(3-dimethylaminopropyl) carbidiimide and N-hydroxythiosuccinimide.

In an exemplary embodiment of the disclosure, the first quantum dot body in the first quantum dot film layer and the second quantum dot body in the second quantum dot film layer located in the same predetermined region have the same core-shell material, and their particle sizes are substantially the same.

According to the second aspect of the disclosure, a quantum dot light emitting layer is provided. The material of the quantum dot light emitting layer includes a first quantum dot body, a first ligand, a second quantum dot body, and a second ligand. A coordinate bond is formed between the first ligand and the first quantum dot body, and a coordinate bond is formed between the second ligand and the second quantum dot body. A cross-linkage or a salt insoluble in the developer is formed via a reaction between the first ligand and the second ligand.

In an exemplary embodiment of the disclosure, the first ligand includes a first coordination group and a cross-linkable group connected with each other, and a coordinate bond is formed between the first coordination group and the first quantum dot body. The second ligand includes a second coordination group and amino group connected with each other, and a coordinate bond is formed between the second coordination group and the second quantum dot body. A cross-linkage or a salt insoluble in the developer is formed via a reaction between the cross-linkable group and the amino group in the second ligand.

In an exemplary embodiment of the disclosure, the quantum dot light emitting layer includes at least one first light emitting layer and at least one second light emitting layer, wherein the first light emitting layer and the second light emitting layer are stacked. The material of the first light emitting layer includes the first quantum dot body and the first ligand, and the material of the second light emitting layer includes the second quantum dot body and the second ligand.

In an exemplary embodiment of the disclosure, the cross-linkable group is selected from carboxylic acid group, sulfonic acid group,

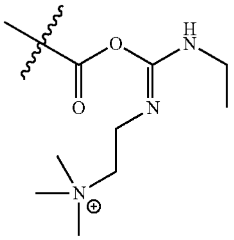

,

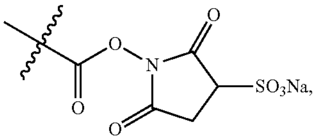

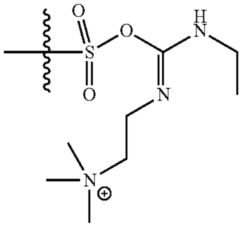

or

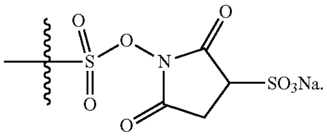

In an exemplary embodiment of the disclosure, the material of the quantum dot light emitting layer includes the following structure:

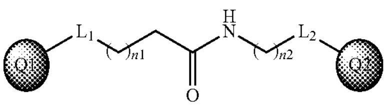

or

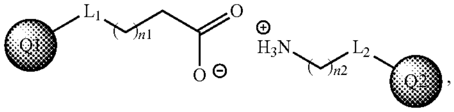

, wherein Q1 is the first quantum dot body, Q2 is the second quantum dot body; $L_1$ is a first coordination group that forms a coordinate bond with the first quantum dot body; $L_2$ is a second coordination group that forms a coordinate bond with the second quantum dot body; $n_1$ is selected from any integer from 1 to 7; $n_2$ is selected from any integer from 0 to 8.

In an exemplary embodiment of the disclosure, the first quantum dot body and the second quantum dot body have the same core-shell material, and their particle sizes are substantially the same.

According to the third aspect of the disclosure, a quantum dot mixture is provided, which includes a first quantum dot body, a first ligand, a second quantum dot body, and a second ligand. The first ligand includes a first coordination group and a cross-linkable group connected with each other, and a coordinate bond is formed between the first coordination group and the first quantum dot body. The second ligand includes a second coordination group and Z group connected with each other, and a coordinate bond is formed between the second coordination group and the second quantum dot body. The structure of the Z group is -A-B, where A is imino group and B is a protective group. Wherein, the first ligand can ionize in an alkaline solution. Under light conditions, the Z group can remove the protective group to form amino group under the action of a photo-acid generator. The cross-linkable group can crosslink with the amino group formed by removing the protective group from the Z group or form a salt insoluble in the developer. Alternatively, the cross-linkable group activated by an activator, can crosslink with the amino group formed by removing the protective group from the Z group or form a salt insoluble in the developer.

In an exemplary embodiment of the disclosure, the cross-linkable group is selected from a carboxylic acid group or a sulfonic acid group.

The activator is selected from one or two of 1-ethyl-(3-dimethylaminopropyl) carbidiimide and N-hydroxythiosuccinimide.

In an exemplary embodiment of the disclosure, the first ligand further includes a first connecting group, which is connected between the first coordination group and the cross-linkable matrix.

The second ligand further includes a second connecting group, which is connected between the second coordination group and the amino group.

The first connecting group and the second connecting group are selected from alkylene groups with a carbon atom number of 1 to 8.

In an exemplary embodiment of the disclosure, the first ligand further includes a soluble group, which is connected between the first coordination group and the cross-linkable matrix, and the soluble group is selected from the polar group.

In an exemplary embodiment of the disclosure, the protective group is selected from a group consisting of the following structures:

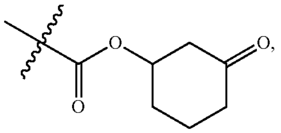

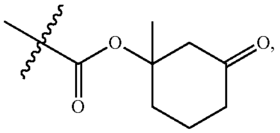

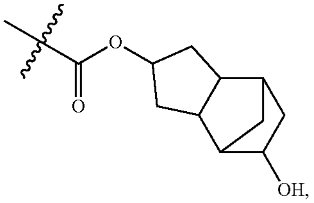

-continued

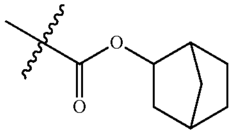

and

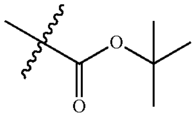

wherein  represents a chemical bond.

In an exemplary embodiment of the disclosure, the first ligand is selected from a group composed of the following structures:

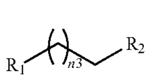

and

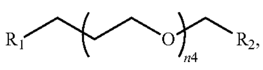

wherein, $R_1$ is selected from amino group, carboxylic acid group, thiol group, phosphonic group, phosphooxy group or disulfide group; $R_2$ is selected from carboxylic acid group or sulfonic acid group; n3 is selected from any integer from 1 to 7; n4 is selected from any integer from 1 to 100.

In an exemplary embodiment of the disclosure, the second ligand is selected from the following structure:

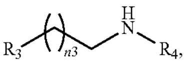

wherein, $R_3$ is selected from amino group, carboxylic acid group, thiol group, phosphonic group, phosphooxy group or disulfide group; $R_4$ is selected from a group composed of the following structures:

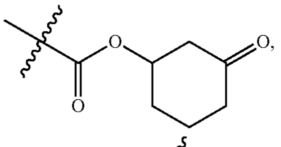

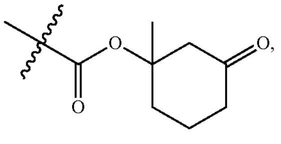

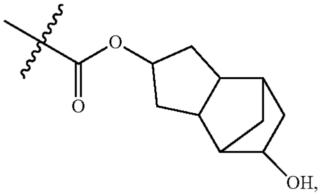

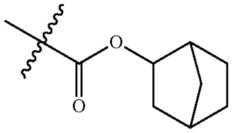

and

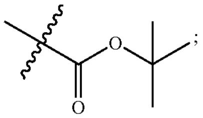

n3 is selected from any integer from 0 to 7.

According to the fourth aspect of the disclosure, a quantum dot light emitting device is provided, which includes a functional layer, and the functional layer includes the quantum dot light emitting layer as described in any embodiment of the second aspect.

According to the fifth aspect of the disclosure, a display device is provided, which includes a quantum dot light emitting device as described in the fourth aspect.

The preparation method of the quantum dot light emitting layer provided by the disclosure involves exposing a predetermined region of the substrate to make the materials contained in the quantum dot film layer to crosslink or form a salt insoluble in the developer. Subsequently, during the development process, the quantum dot film layer of the predetermined region is insoluble in the developer, while the quantum dot film layer of the non-predetermined region is soluble in the developer, providing a basis for the formation of the quantum dot light emitting layer using photolithography technology.

BRIEF DESCRIPTION OF THE DRAWINGS

The above and other features and advantages of the disclosure will become more apparent from the detailed description of the exemplary embodiments with reference to the following figures.

DETAILED DESCRIPTION

Figure 1:
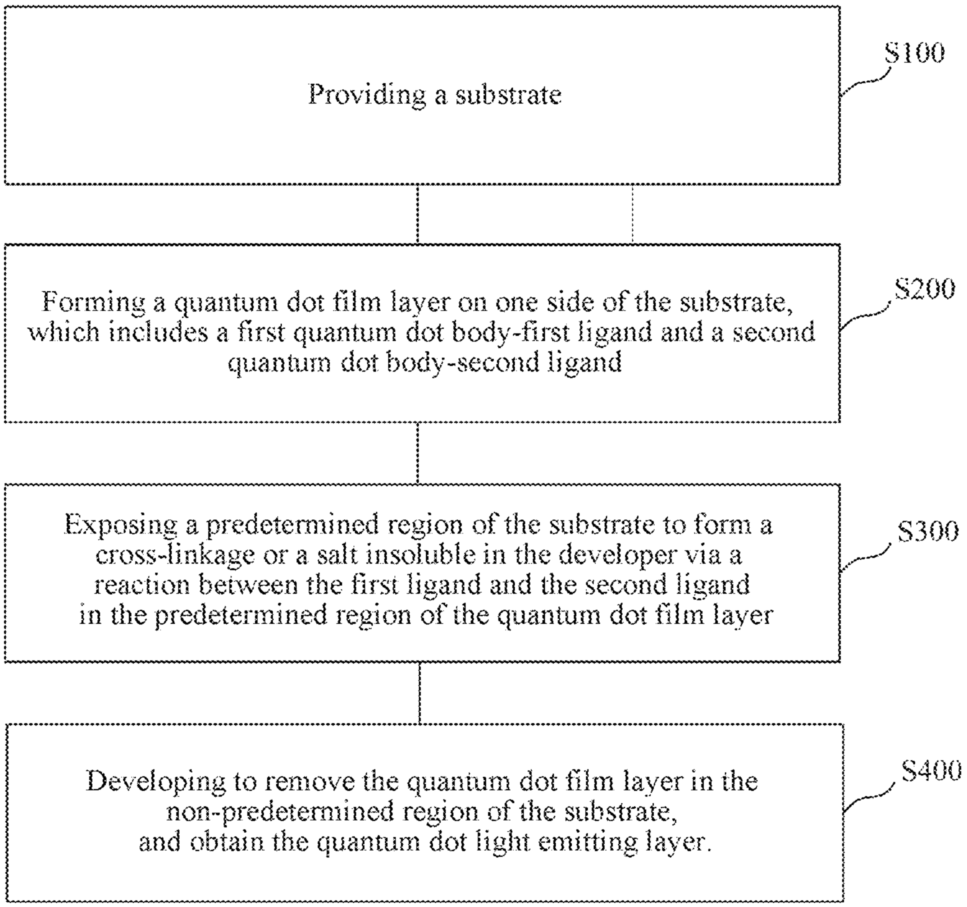
FIG. 1 is a schematic diagram of the preparation method of the quantum dot light emitting layer in the exemplary embodiment of the disclosure.
Figure 2:
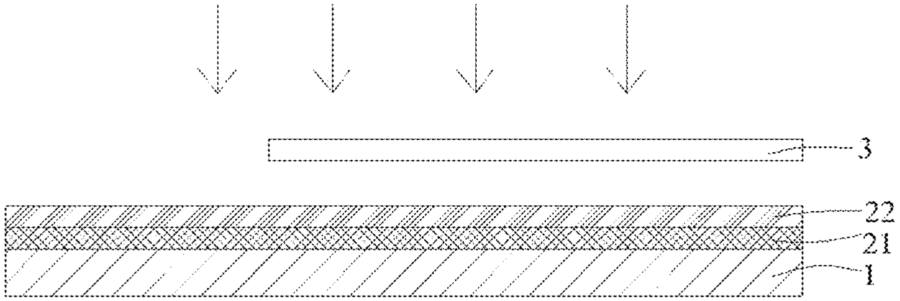
FIG. 2 is a schematic diagram of forming the structure of the first quantum dot film layer and the second quantum dot film layer in the exemplary embodiment of the disclosure.
Figure 3:
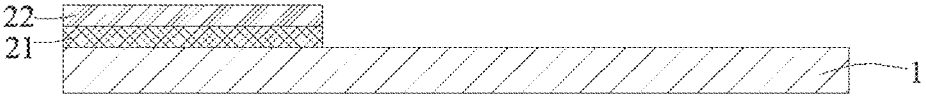
FIG. 3 is a schematic diagram of forming the structure of the quantum dot light emitting layer in the exemplary embodiment of the disclosure.
Figure 4:
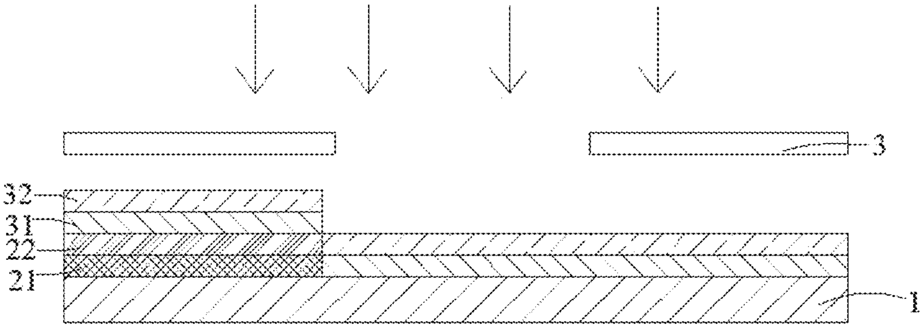
FIG. 4 is a schematic diagram of forming the structure of the first quantum dot film layer and the second quantum dot film layer in another exemplary embodiment of the disclosure.
Figure 5:
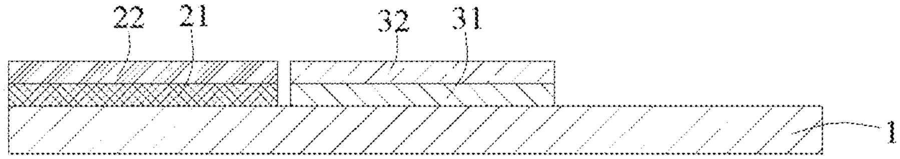
FIG. 5 is a schematic diagram of forming the structure of a quantum dot light emitting layer in another exemplary embodiment of the disclosure.
Figure 6:
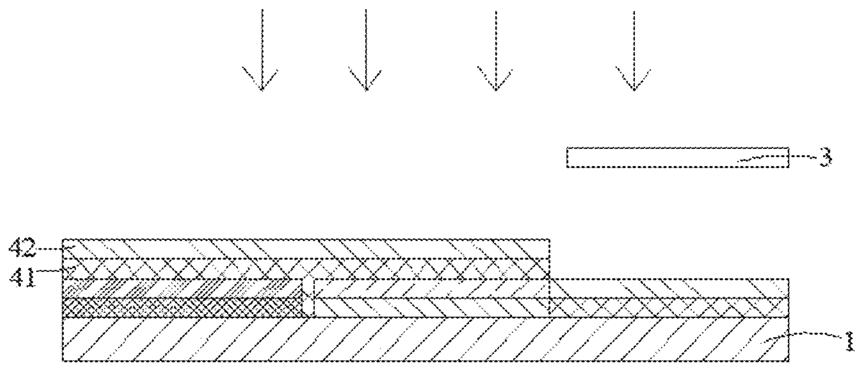
FIG. 6 is a schematic diagram of forming the structure of the first quantum dot film layer and the second quantum dot film layer in another exemplary embodiment of the disclosure.
Figure 7:
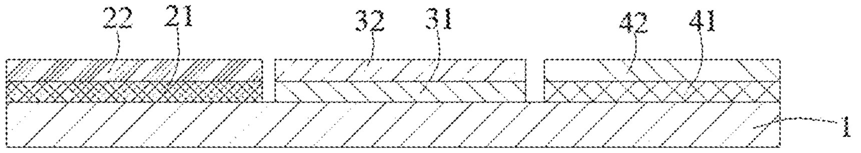
FIG. 7 is a schematic diagram of forming the structure of a quantum dot light emitting layer in another exemplary embodiment of the disclosure.

Example embodiments will now be described more fully with reference to the accompanying drawings. However, the example embodiments can be implemented in various forms, and should not be construed as being limited to the embodiments set forth herein. On the contrary, these embodiments are provided so that the disclosure will be comprehensive and complete, and fully convey the concept of the example embodiments to those skilled in the art. The described features, structures, or characteristics can be combined in one or more embodiments in any suitable manner. In the following description, many specific details are provided to provide a full understanding of the disclosed embodiments.

In the figure, the thickness of the region and layer may have been exaggerated for clarity. The same reference numerals in the figure represent the same or similar structures, therefore their detailed descriptions will be omitted.

The described features, structures, or characteristics can be combined in one or more embodiments in any suitable manner. In the following description, many specific details are provided to provide a full understanding of the embodiments of the disclosure. However, those skilled in the art will be mean that the disclosed technical solution can be practiced without one or more of the specific details described, or other methods, components, materials, and the like may be employed. In other cases, the well-known structures, materials, or operations are not shown or described in detail to avoid blurring the main technical ideas disclosed in the disclosure.

When a certain structure is "on" other structures, it may refer to a structure being formed as a whole on other structures, or a structure being "directly" disposed on other structures, or a structure being "indirectly" disposed on other structures through another structure.

The terms "a", "one", "the" are used to indicate the existence of one or more elements/components/and the like. The terms "including" and "comprising" are used to indicate open inclusion and refer to the existence of additional elements/components/and the like in addition to the listed ones. The terms "first" and "second" are only used as markers and do not limit the number of their objects.

Quantum Dots (QD), composed of zinc, cadmium, selenium and sulfur atoms, is a nanometer material with a crystal diameter of 2-10 nm. Its photoelectric characteristics are unique. After being stimulated by photoelectric, it will emit pure monochromatic radiation light of different colors according to the diameter of the quantum dot, which can change the color of the light source.

Quantum dots are generally used to form quantum dot light emitting layers of quantum dot light emitting devices. The quantum dot light emitting device generally includes an anode, a hole transport layer, a quantum dot light emitting layer, an electron transport layer and a cathode disposed sequentially in layers. When the voltage is applied to the cathode and anode, an electric field is generated between the two electrodes. Under the effect of the electric field, the electrons on the cathode side move towards the quantum dot film layer, and the holes on the anode side also move towards the light emitting layer. The electrons and holes combine in the quantum dot light emitting layer to form excitons, which release energy outward in the excited state, thus making the quantum dot light emitting layer emit light outward.

In related technologies, quantum dots cannot achieve the same evaporation method as self-luminescent OLEDs due to their susceptibility to heat and moisture, and can only be inkjet printing at present. However, it is difficult to achieve high resolution through inkjet printing.

As shown in FIG. 1, the disclosure provides a preparation method of a quantum dot light emitting layer, which includes the following steps:

Step S100, providing the substrate;

Step S200, forming a quantum dot film layer on one side of the substrate, the material of which includes a first quantum dot body-first ligand and a second quantum dot body-second ligand;

Step S300, exposing a predetermined region of the substrate to form a crosslinkage or a salt insoluble in the developer via a reaction between the first ligand and the second ligand;

Step S400, developing to remove the quantum dot film layer located in the non-predetermined region of the substrate, and obtain the quantum dot light emitting layer.

The preparation method of the quantum dot light emitting layer provided by the disclosure involves exposing a predetermined region of the substrate to make the materials contained in the quantum dot film layer to crosslink or form a salt insoluble in the developer. Subsequently, during the development process, the quantum dot film layer of the predetermined region is insoluble in the developer, while the quantum dot film layer of the non-predetermined region is soluble in the developer, providing a basis for the formation of the quantum dot light emitting layer using photolithography technology.

In the disclosure, the first quantum dot body-first ligand is soluble in the developer. The second quantum dot body-second ligand is insoluble in the developer after being exposed. The first ligand of the first quantum dot body-first ligand includes a cross-linkable group. The second ligand of the second quantum dot body-second ligand includes Z group, the structure of the Z group is -A-B, where A is imino group, and B is a protective group. Under light conditions, the Z group can remove the protective group to form amino group under the action of a photo-acid generator, and the formed amino group can crosslink with the cross-linkable group or form a salt insoluble in the developer.

The following is a detailed explanation of the preparation method of the quantum dot light emitting layer provided by the embodiment of the present disclosure in conjunction with the accompanying drawings:

Step S100, providing the substrate.

The substrate can be inorganic materials such as glass substrate or metal substrate; organic materials such as polycarbonate, polymethyl methacrylate, polyethylene terephthalate, polyethylene naphthalate, polyamide, polyethersulfone, or a combination thereof; silicon wafer; or composite material layers and the like, and it is not limited in the disclosure.

Step S200, forming a quantum dot film layer on one side of the substrate, and the material of the quantum dot film layer includes the first quantum dot body-first ligand and the second quantum dot body-second ligand.

In some embodiments of the disclosure, Step S200 includes:

Step S210, forming at least one first quantum dot film layer and at least one second quantum dot film layer on one side of the substrate, with the first quantum dot film layer and the second quantum dot film layer being stacked;

The material of the first quantum dot film layer includes the first quantum dot body-first ligand, and the material of the second quantum dot film layer includes the second quantum dot body-second ligand.

In some embodiments of the disclosure, Step S210 includes:

Step S211, providing a first quantum dot body-first ligand solution;

Step S212, applying the first quantum dot body-first ligand solution on one side of the substrate to form the first quantum dot film layer;

Step S213, providing a mixed solution of the second quantum dot body-second ligand solution and the photo-acid generator;

Step S214, applying the mixed solution of the second quantum dot body-second ligand and the photo-acid generator on the side of the first quantum dot film layer far from the substrate to form the second quantum dot film layer.

Wherein, the first ligand of the first quantum dot body-first ligand solution contains a cross-linkable group;

The second ligand of the second quantum dot body-second ligand solution contains Z group, the structure of the Z group is-A-B, where A is imino group, and B is a protective group.

Under light conditions, the Z group can remove the protective group to form amino group under the action of the photo-acid generator, and the crosslinkage or the salt insoluble in the developer is via the reaction between the formed amino group and the cross-linkable group.

Quantum dots (QDs) are inorganic semiconductor nanoparticles synthesized by solution method with a size between 1-10 nm, which is about or less than the exciton Bohr radius of the particle. Due to their small size and large specific surface area, quantum dots are prone to agglomeration, and their surface defects are numerous. Therefore, when applied, the surface of quantum dots is usually coated with organic surface ligands, which not only protect them but also provide good solubility in solution. The migration of carriers (electrons and holes) in quantum dots is limited to the interior of the dots, which makes them with unique optical and electrical properties. Due to its unique size dependent properties, the light absorption performance and the luminescence performance of quantum dots can be easily adjusted by controlling particle size, shape, or surface structure.

The quantum dot body in the disclosure refers to the quantum dots said above, which can be semiconductor nanocrystals and can have various shapes such as spherical, conical, multi armed, and/or cubic nanoparticles, nanotubes, nanowires, nanofibers, nanoplate particles, quantum rods, or quantum sheets. Here, a quantum rod can be a quantum dot body with an aspect ratio (length-diameter ratio) (length to width ratio) greater than or equal to about 1, for example greater than or equal to about 2, greater than or equal to about 3, or greater than or equal to about 5. For example, quantum rods can have an aspect ratio of less than or equal to about 50, less than or equal to about 30, or less than or equal to about 20.

The quantum dot body may have, for example, particle diameter from about 1 nm to about 100 nm, from about 1 nm to about 80 nm, from about 1 nm to about 50 nm, or from about 1 nm to 20 nm (for non-spherical shapes, the average maximum particle length).

The energy band gap of the quantum dot body can be controlled based on its size and composition, and therefore the emission wavelength can be controlled. For example, when the size of the quantum dot body increases, the quantum dot body can have a narrow band gap and therefore be configured to emit light in a relatively long wavelength region, while when the size of the quantum dot body decreases, the quantum dot body can have a wide band gap and therefore be configured to emit light in a relatively short wavelength region. For example, the quantum dot body can be configured to emit light in a predetermined wavelength region of the visible light region based on its size and/or composition. For example, the quantum dot body can be configured to emit a second color light, a third color light, or a first color light, and the second color light can have a peak emission wavelength from about 430 nm to about 480 nm, for example ($\lambda$ maximum), the third color light may have a peak emission wavelength, such as within the range of about 600 nm to about 650 nm ($\lambda$ maximum), and the first color light may have a peak emission wavelength from about 520 nm to about 560 nm, for example ($\lambda$ maximum), but not limited to thereto.

For example, the average particle size of the quantum dot body configured to emit the second color light can be, for example, less than or equal to about 4.5 nm, and less than or equal to about 4.3 nm, less than or equal to about 4.2 nm, less than or equal to about 4.1 nm, or less than or equal to about 4.0 nm. Within the range, for example, the average particle size of the quantum dot body can be from about 2.0 nm to about 4.5 nm, such as from about 2.0 nm to about 4.3 nm, from about 2.0 nm to about 4.2 nm, from about 2.0 nm to about 4.1 nm, or from about 2.0 nm to about 4.0 nm.

The quantum dot body may have a quantum yield of, for example, greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot body can have a relatively narrow half width (FWHM). Here, FWHM is the width of the wavelength corresponding to half of the peak absorption point, and when FWHM is narrower, it can be configured to emit light in a narrower wavelength region and achieve higher color purity. The quantum dot body may have FWHM of, for example, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the range, it can have FWHM of, for example, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 2 nm to about 32 nm, about 2 nm to about 31 nm, about 2 nm to about 30 nm, about 2 nm to about 29 nm, or about 2 nm to about 28 nm.

For example, the quantum dot body can include a group II-VI semiconductor compound, a group III-V semiconductor compound, a group IV-VI semiconductor compound, a group IV semiconductor compound, a group I-III-VI semiconductor compound, a group I-II-IV-VI semiconductor compound, a group II-III-V semiconductor compound, or a combination thereof. The group II-VI semiconductor compound may be selected from, for example, a binary compound such as CdSe, CdTe, ZnS, ZnSe, ZnTe, ZnO, HgS, HgSe, HgTe, MgSe, MgS, or a combination thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but not limited to thereto. The group III-V semiconductor compound can be selected from, for example, a binary compound such as GaN, GaP, GaAs, GaSb, AlN, AIP, AlAs, AlSb, InN, InP, InAs, InSb, or a combination thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary compound such as GaAlNP, GaAlNAs, GaAlNSb, GaAlPAs, GaAlPSb, GaInNP, GalnNAs, GaInNSb, GalnPAs, GaInPSb, InAlNP, InAlNAs, InAlNSb, InAlPAs, InAlPSb, or a combination thereof, but not limited to thereto. The group IV-VI semiconductor compound may be selected from, for example, a binary compound such as SnS, SnSe, SnTe, PbS, PbSe, PbTe, or a combination thereof; a ternary compound such as SnSeS, SnSeTe, SnSTe, PbSeS, PbSeTe, PbSTe, SnPbS, SnPbSe, SnPbTe, or a combination thereof; and a quaternary compound such as SnPbSSe, SnPbSeTe, SnPbSTe, or a combination thereof, but not limited to thereto. The group IV semiconductor compound can be selected from, for example, an simple (unary) semiconductor such as Si, Ge, or a combination thereof; and a binary semiconductor compound such as SiC, SiGe, and a combination thereof, but not limited to thereto. The group I-III-VI semiconductor compound can be, for example, $CuInSe_2$, $CuInS_2$, CuInGaSe, CuInGaS, or a combination thereof, but are not limited to thereto. The group I-II-IV-VI semiconductor compound can be, but are not limited to, CuZnSnSe, CuZnSnS, or a combination thereof. The group II-III-V semiconductor compound may include, but are not limited to, InZnP.

The quantum dot body can have substantially uniform concentration or locally different concentration distribution, including the simple semiconductor, the binary semiconductor compound, the ternary semiconductor compound, or the quaternary semiconductor compound.

For example, the quantum dot body can include a cadmium-free (Cd) quantum dot body. The cadmium-free quantum dot body is a quantum dot body that does not include cadmium (Cd). Cadmium (Cd) can cause serious environmental/health problems and is a restricted element under the Restriction of Hazardous Substances (RoHS) in multiple countries, and therefore the cadmium-free based quantum dot body can be effectively used.

As an example, the quantum dot body can be a semiconductor compound including at least one of zinc (Zn), tellurium (Te), and selenium (Se). For example, the quantum dot body can be a Zn—Te semiconductor compound, a Zn—Se semiconductor compound, and/or a Zn—Te—Se semiconductor compound. For example, the amount of tellurium (Te) in the Zn—Te—Se semiconductor compound can be less than the amount of selenium (Se). The semiconductor compound can have a peak emission wavelength in a wavelength range of less than or equal to about 480 nm, such as about 430 nm to about 480 nm ($\lambda$ maximum), and can be configured to emit the second color light.

For example, the quantum dot body can be a semiconductor compound including at least one of indium (In), zinc (Zn), and phosphorus (P). For example, the quantum dot body can be In—P semiconductor compound and/or In—Zn—P semiconductor compound. For example, The molar ratio of zinc (Zn) to indium (In) in the In—Zn—P semiconductor compound can be greater than or equal to about 25. The semiconductor compound can have a peak emission wavelength in a wavelength range of less than about 700 nm, such as about 600 nm to about 650 nm ($\lambda$ Maximum), and can be configured to emit the third color light.

The quantum dot body can have a core-shell structure, where one quantum dot body surrounds another quantum dot body. For example, the core and shell of the quantum dot body may have an interface, and at least one element of the core or shell in the interface may have a concentration gradient, with the concentration of the shell element decreasing towards the core. For example, the material composition of the shell of the quantum dot body has a higher energy band gap than the material composition of the core of the quantum dot body, and thus the quantum dot body can exhibit a quantum confinement effect.

The quantum dot body can have a quantum dot core and a multi-layer quantum dot shell surrounding the core. Here, the multi-layer shell has at least two shell layers, each of which can be a single composition, alloy, and/or a shell layer with a concentration gradient.

For example, the shell far from the core of a multi-layer shell can have a higher energy band gap than the shell near the core, and thus the quantum dot can exhibit a quantum confinement effect.

For example, a quantum dot body with a core-shell structure may include, for example, a core, including a first semiconductor compound including at least one of zinc (Zn), tellurium (Te) and selenium (Se); and a shell disposed on at least a portion of the core and including a second semiconductor compound with a composition different from that of the core.

For example, the first semiconductor compound can be Zn—Te—Se based semiconductor compound that includes zinc (Zn), tellurium (Te), and selenium (Se), for example, Zn—Se based semiconductor compound that includes a small amount of tellurium (Te), for example, a semiconductor compound represented by ZnTexSe1-x, where x is greater than about 0 and less than or equal to 0.05.

For example, in the first semiconductor compound based on Zn—Te—Se, the molar amount of zinc (Zn) can be higher than that of selenium (Se), and the molar amount of selenium (Se) can be higher than that of tellurium (Te). For example, in the first semiconductor compound, the molar ratio of tellurium (Te) to selenium (Se) can be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.039, less than or equal to about 0.035 Less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013 Less than or equal to about 0.012, less than or equal to about 0.011, or less than or equal to about 0.01. For example, in the first semiconductor compound, the molar ratio of tellurium (Te) to zinc (Zn) can be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include, for example, a group II-VI semiconductor compound, a group IV semiconductor compound, a group I-III-VI semiconductor compound, a group I-II-IV-VI semiconductor compound, a group II-III-V semiconductor compound, or a combination thereof. The examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as described above.

For example, the second semiconductor compound may include zinc (Zn), selenium (Se), and/or sulfur(S). For example, the shell may include ZnSeS, ZnSe, ZnS, or a combination thereof. For example, the shell may include at least one inner shell near the core and the outermost shell at the outermost side of the quantum dot body. The inner shell may include ZnSeS, ZnSe, or a combination thereof, and the outermost shell may include ZnS. For example, the shell can have a concentration gradient of a component, and for example the amount of sulfur(S) can increase as far from the core.

For example, the quantum dot body with a core-shell structure may include: a core, including a third semiconductor compound including indium (In), as well as at least one of zinc (Zn) and phosphorus (P); and a shell disposed on at least a portion of the core and including a fourth semiconductor compound with a composition different from that of the core.

In the third semiconductor compound based on In—Zn—P, the molar ratio of zinc (Zn) to indium (In) can be greater than or equal to about 25. For example, in the third semiconductor compound based on In—Zn—P, the molar ratio of zinc (Zn) to indium (In) can be greater than or equal to about 28, greater than or equal to about 29, or greater than or equal to about 30. For example, in the third semiconductor compound based on In—Zn—P, the molar ratio of zinc (Zn) to indium (In) can be less than or equal to about 55, such as less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a group II-VI semiconductor compound, a group IV semiconductor compound, a group I-III-VI semiconductor compound, a group I-II-IV-VI semiconductor compound, a group II-III-V semiconductor compound, or a combination thereof. The examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as described above.

For example, the fourth semiconductor compound may include zinc (Zn) and sulfur(S), as well as optionally selenium (Se). For example, the shell may include ZnSeS, ZnSe, ZnS, or a combination thereof. For example, the shell may include at least one inner shell near the core and the outermost shell at the outermost side of the quantum dot body. At least one of the inner shell and the outermost shell can include the fourth semiconductor compound ZnS, ZnSe, or ZnSeS.

In the disclosure, both the first quantum dot body in the first quantum dot body-first ligand solution and the second quantum dot body in the second quantum dot body-second ligand solution can be selected from any of the quantum dot bodies said above, and the two can be the same or different.

In some embodiments of the disclosure, the core-shell materials of the first quantum dot body of the first quantum dot film layer and the second quantum dot body of the second quantum dot film layer in the same predetermined region are the same, and the particle sizes are substantially the same. Specifically, the difference in particle size between the first quantum dot body and the second quantum dot body is not greater than 10%, and further, it may not be greater than 8%, 7%, 6%, 5%, 4%, 3%, 2%, or 1%, but is not limited to thereto.

In Step S210, providing the first quantum dot body-first ligand solution.

The first quantum dot body-first ligand solution can contain the first quantum dot body and the first ligand, and the first ligand forms a coordinate bond with the first quantum dot body through a coordination group.

Specifically, the first ligand can contain a first coordination group, and the coordinate bond is formed between the first coordination group and the first quantum dot body. The first coordination group is selected from amino group, carboxylic acid group, thiol group, phosphonic group, or phosphooxy group. The first coordination group can also be selected from the disulfide group.

In the disclosure, the disulfide group can be a structure shown as

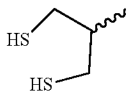

formed by

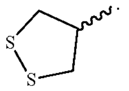

Furthermore, the first ligand can further include a first connecting group, which is connected between the first coordination group and the cross-linkable group. The first connecting group is selected from an alkylene group with a carbon atom number of 1 to 8, and the specific carbon atom number can be 2, 3, 4, 5, 6, 7 or 8.

In some embodiments of the disclosure, the cross-linkable groups of the first ligand is selected from carboxylic group or sulfonic group, which crosslink with amino groups or form salts insoluble in the developer under light conditions, i.e. exposing. It should be noted that the number of cross-linkable groups contained in the first ligand can be multiple, and is not limited in the disclosure.

In other embodiments of the disclosure, Step S210 includes:

Step S211, providing a first quantum dot body-first ligand matrix solution;

Step S212, adding an activator to the first quantum dot body-first ligand matrix solution, activating the first ligand matrix in the first quantum dot body-first ligand matrix solution to the first ligand, to obtain the first quantum dot body-first ligand solution.

Wherein, the first ligand matrix includes a cross-linkable matrix, which is selected from carboxylic acid group or sulfonic acid group.

The cross-linkable group is selected from

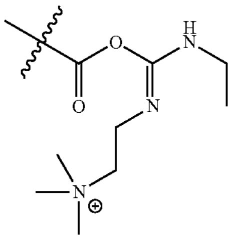

,

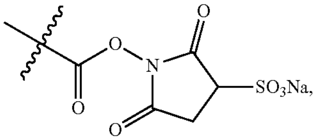

,

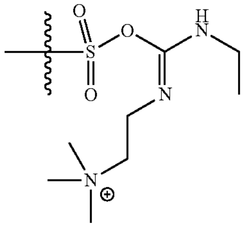

or

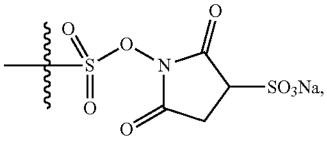

, wherein  represents a chemical bond.

In these embodiments, the cross-linkable matrix is activated into the cross-linkable group under the action of the activator, specifically, the carboxylic acid group can be activated into

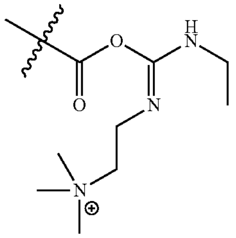

or

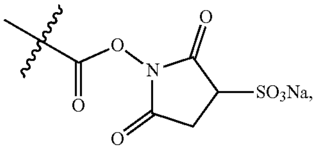

, and the sulfonic acid group can be activated to

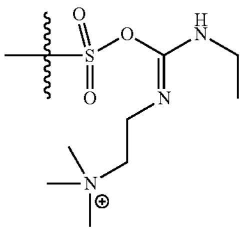

or

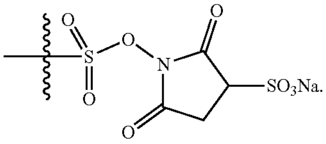

.

In some embodiments of the disclosure, the activator is selected from one or two of 1-ethyl-(3-dimethylaminopropyl) carbidiimide, and N-hydroxythiosuccinimide, that is, one or two of EDC and sulfo-NHS.

In Step S220, applying the first quantum dot body-first ligand solution on one side of the substrate to form the first quantum dot film layer.

In this step, the thickness of the first quantum dot film layer formed is 15 nm to 25 nm, which can be 15 nm, 16 nm, 17 nm, 18 nm, 19 nm, 20 nm, 21 nm, 22 nm, 23 nm, 24 nm or 25 nm.

In Step S230, providing the mixed solution of the second quantum dot body-second ligand solution and the photo-acid generator.

In this step, the second ligand of the second quantum dot body-the second ligand forms a coordinate bond between the coordinate group and the second quantum dot body. Specifically, the second ligand may include a second coordination group, which is selected from amino group, carboxylic acid group, thiol group, phosphonic group, or phosphooxy group. The second coordination group can also be selected from disulfide group.

The second ligand of the second quantum dot body-second ligand solution contains the Z group, the structure of the Z group is-A-B, where A is imino group, and B is a protective group.

In some embodiments of the disclosure, the protection group is selected from the group consisting of the following structure:

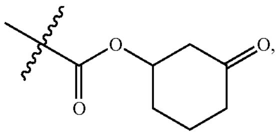,
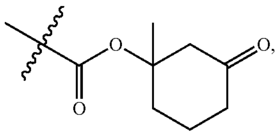,
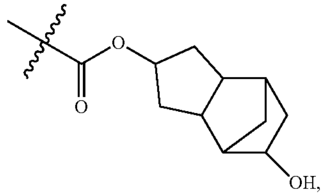,
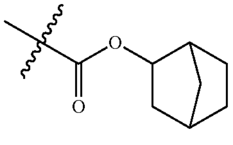
and
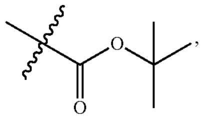, wherein -ξ- represents a chemical bond.

Under light conditions, the Z group can remove the protective group to form amino group under the action of the photo-acid generator, and the formed amino group can crosslink with the cross-linkable group or form the salt insoluble in the developer.

The second ligand can further include a second connecting group, which is connected between the second coordination group and amino group. The second connecting group is selected from alkylene group with a carbon atom number of 1 to 8, and the specific carbon atom number can be 2, 3, 4, 5, 6, 7 or 8.

In Step S240, applying the mixed solution of the second quantum dot body, the second ligand, and the photo-acid generator on the side of the first quantum dot film layer far from the substrate to form the second quantum dot film layer.

In this step, the thickness of the second quantum dot film layer formed is 15 nm to 25 nm, which can be 15 nm, 16 nm, 17 nm, 18 nm, 19 nm, 20 nm, 21 nm, 22 nm, 23 nm, 24 nm or 25 nm.

In some embodiments of the disclosure, Steps S220 and S240 can be alternately repeated to form the stacked first quantum dot film layer and the second quantum dot film layer. The total thicknesses of all the first and second quantum dot film layers is not more than 50 nm, and further, quantum dot light emitting layers capable of emitting light of different colors can be formed.

In other embodiments of the disclosure, Step S200 includes:

Step S210, providing a mixed solution of a first quantum dot body-first ligand solution, a second quantum dot body-second ligand solution, and a photo-acid generator;

Step S220, applying the mixed solution of the first quantum dot body-first ligand solution, the second quantum dot body-second ligand solution, and the photo-acid generator on one side of the substrate to form a quantum dot film layer.

Wherein, the first ligand of the first quantum dot body-first ligand solution contains the cross-linkable group.

The second ligand of the second quantum dot body-second ligand solution contains the Z group, the structure of the Z group is-A-B, where A is imino group, and B is a protective group.

Under light conditions, the Z group can remove the protective group to form. amino group under the action of the photo-acid generator, and the formed amino group can crosslink with the cross-linkable group or form salts insoluble in the developer.

The method for obtaining the mixed solution of the first quantum dot body-first ligand solution, the second quantum dot body-second ligand solution, and the photogenic acid generator, as well as the selection of the first quantum dot body, first ligand, second quantum dot body, and second ligand, can refer to the above embodiments and will not be elaborated here.

In the same way, in this embodiment, quantum dot film layers can also be formed repeatedly to form quantum dot light emitting layers capable of emitting different colors. When different quantum dot film layers are formed, the quantum dot bodies in different quantum dot film layers, including the first and second quantum dot bodies, can be different.

In Step S300, exposing the predetermined region of the substrate to form a crosslinkage or a salt insoluble in the developer via a reaction between the first ligand and the second ligand.

In this step, the predetermined region can be set according to actual needs, and is not limited in the disclosure. After exposing, the quantum dot film layers in the predetermined region are cross-linked and insoluble in the developer, and the formed salt is also insoluble in the developer.

It should be noted that, in the disclosure, the first quantum dot body-first ligand is soluble in the developer. The second quantum dot body-the second ligand is insoluble in the developer after being exposed. When the quantum dot film layers include the first quantum dot film layer and the second quantum dot film layer, the second quantum dot film layer in the predetermined region is insoluble in the developer after being exposed, and the materials in the first and second quantum dot film layers in the predetermined region are also insoluble in the developer after crosslinking or salinization, and the solubility of the materials contained in the final quantum dot light emitting layer in the developer is lower than that of the materials contained in the second quantum dot film layer after being exposed in the developer.

In Step S400, developing to remove the quantum dot film layer in the non-predetermined region of the substrate, and obtain the quantum dot light emitting layer.

The quantum dot film layers in the non-predetermined region, that is the non-exposed region, has not undergone cross-linking or salinization, and can be soluble in the developer.

When the quantum dot film layers include the first and second quantum dot film layers, the material of the first quantum dot film layer is soluble in the developer. Therefore, when developing, the first quantum dot film layer in the non-predetermined region begins to dissolve and takes away the second quantum dot film layer in this region. The first quantum dot film layer in the predetermined region is insoluble in the developer due to cross-linking or salinization with the second quantum dot film layer. That is, when developing, the first and second quantum dot film layers in the predetermined region do not dissolve, thereby forming the quantum dot light emitting layer.

In some embodiments of the disclosure, the first quantum dot film layer and the second quantum dot film layer can be repeatedly formed to form the stacked first quantum dot film layer and a second quantum dot film layer. The total thickness of all the first and second quantum dot film layers is not more than 50 nm, and further, quantum dot light emitting layers capable of emitting light of different colors can be formed.

For example, as shown in FIGS. 2 to 7, the first quantum dot film layer 21 and the second quantum dot film layer 22 can be formed on one side of the substrate 1, exposed in the predetermined region, and subsequently developed to form the first light emitting layer 211 and the second light emitting layer 221. The first light emitting layer 211 and the second light emitting layer 221 can emit light of the first color.

Subsequently, the first quantum dot film layer 31 and the second quantum dot film layer 32 are formed, exposed in the predetermined region, and subsequently developed to form the first light emitting layer 311 and the second light emitting layer 321. The first light emitting layer 311 and the second light emitting layer 321 can emit light of the second color.

Furthermore, the first quantum dot film layer 41 and the second quantum dot film layer 42 are formed, exposed in the predetermined region, and subsequently developed to form the first quantum dot light emitting layer 411 and the second quantum dot light emitting layer 421. The first light emitting layer 411 and the second light emitting layer 421 can emit light of the third color.

The disclosure also provides a quantum dot light emitting layer, wherein the material of the quantum dot light emitting layer includes a first quantum dot body, a first ligand, a second quantum dot body, and a second ligand. A coordinate bond is formed between the first ligand and the first quantum dot body, and a coordinate bond is formed between the second ligand and the second quantum dot body. The first and second ligands crosslink or form salts insoluble in the developer.

In some embodiments of the disclosure, the quantum dot light emitting layer is a single-layer structure, while in other embodiments of the disclosure, the quantum dot light emitting layer is a multi-layer structure. For example, the quantum dot light emitting layer includes at least one first light emitting layer and at least one second light emitting layer, with the first light emitting layer and the second light emitting layer stacking. The material of the first light emitting layer includes the first quantum dot body and the first ligand, while the material of the second light emitting layer includes the second quantum dot body and the second ligand.

In some embodiments of the disclosure, the material of the first light emitting layer includes the first quantum dot body and the first ligand, the first ligand includes an first coordination group and a cross-linkable group connected with each other, and a coordinate bond is formed between the first coordination group and the first quantum dot body.

The material of the second light emitting layer includes a second quantum dot body and a second ligand, the second ligand includes a second coordination group and amino group connected with each other, and a coordinate bond is formed between the second coordination group and the second quantum dot body.

The cross-linkable group crosslinks with amino group in the second ligand or forms a salt insoluble in the developer.

In some embodiments of the disclosure, the cross-linkable group is selected from carboxylic acid group, sulfonic acid group,

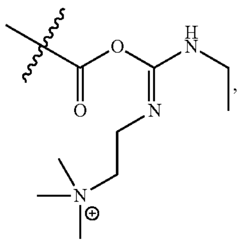

,

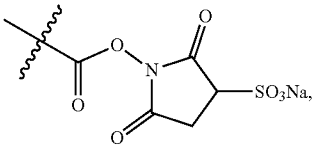

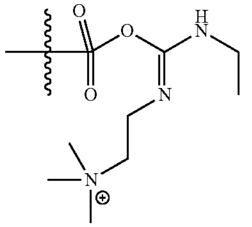

or

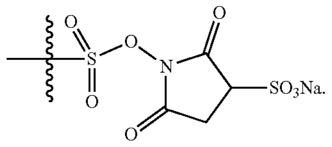

The first and second coordination groups are selected from amino group, carboxylic acid group, thiol group, phosphonic group or phosphooxy group. The first and second coordination groups can also be selected from the disulfide group.

In some embodiments of the disclosure, the first ligand further includes a first connecting group, which is connected between the first coordination group and the cross-linkable group. The second ligand further includes a second connecting group, which is connected between the second coordination group and the amino group. The first and second connecting groups are selected from alkylene groups with a carbon atom number of 1 to 8.

In some embodiments of the disclosure, the material of the quantum dot light emitting layer includes the following structure:

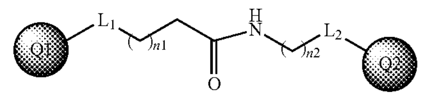

or

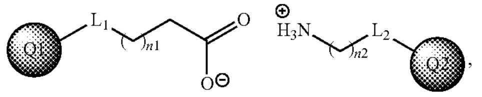

wherein Q1 is the first quantum dot body, Q2 is the second quantum dot body; $L_1$ is a first coordination group that forms a coordinate bond with the first quantum dot body; $L_2$ is a second coordination group that forms a coordinate bond with the second quantum dot body; $n_1$ is selected from any integer from 1 to 7, specifically, it can be 1, 2, 3, 4, 5, 6, or 7; $n_2$ is selected from any integer from 0 to 8, which can be 0, 1, 2, 3, 4, 5, 6, 7, or 8.

In some embodiments of the disclosure, the core-shell materials of the first quantum dot body and the second quantum dot body are the same, and the particle sizes are substantially the same.

The disclosure also provides a quantum dot mixture, including a first quantum dot body, a first ligand, a second quantum dot body, and a second ligand.

The first ligand includes a first coordination group and a cross-linkable group connected with each other, and a coordinate bond is formed between the first coordination group and the first quantum dot body.

The second ligand includes a second coordination group and Z group connected with each other, and a coordinate bond is formed between the second coordination group and the second quantum dot body. The structure of the Z group is-A-B, where A is imino, B is protective group.

Wherein, the first ligand can ionize in an alkaline solution.

Under the condition of light, the Z group can remove the protective group to form amino group under the action of the photo-acid generator.

The cross-linkable group can crosslink with the amino group formed by removing the protective group from the Z group or form salts insoluble in the developer.

Alternatively, the cross-linkable group activated by the activator can crosslink with the amino group formed by removing the protective group from the Z group or form a salt insoluble in the developer.

In some embodiments of the disclosure, the cross-linkable group is selected from carboxylic acid group or sulfonic acid group.

The activator is selected from one or two of 1-ethyl-(3-dimethylaminopropyl) carbidiimide and N-hydroxythiosuccinimide.

In the alkaline solution, the cross-linkable group can ionize, for example carboxylic acid group or sulfonic acid group can ionize in alkaline solution to make the first ligand to dissolve in the alkaline solution.

Under light conditions, the cross-linkable group can directly crosslink with amino group or form the salt insoluble in the developer, or can be activated by the activator to

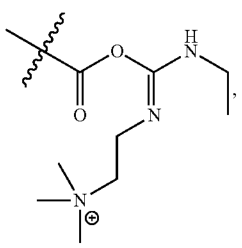

,

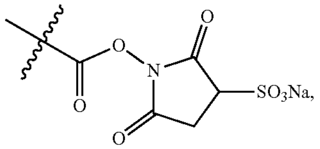

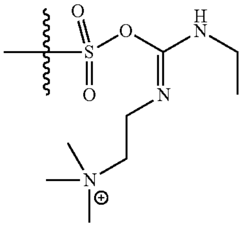

or

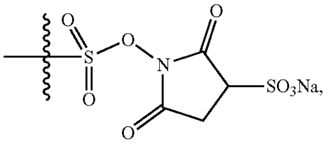

subsequently it cross-links with amino group or forms a salt insoluble in the developer.

As above, the first ligand further includes a first connecting group, which is connected between the first coordination group and the cross-linkable matrix. The second ligand further includes a second connecting group, which is connected between the second coordination group and amino group. The first and second connecting groups are selected from alkylene groups with a carbon atom number of 1 to 8.

In some embodiments of the disclosure, the first ligand further includes a soluble group, which is connected between the first coordination group and the cross-linkable matrix, and the soluble group is selected from polar groups.

In some embodiments of the disclosure, the first ligand is selected from a group composed of the following structures:

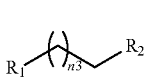

and

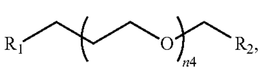

wherein $R_1$ is selected from amino group, carboxylic acid group, thiol group, phosphonic group, phosphooxy group or disulfide group; $R_2$ is selected from carboxylic acid group or sulfonic acid group; n3 is selected from any integer from 1 to 7, which can be 1, 2, 3, 4, 5, 6, or 7, n4 is selected from any integer from 1 to 100.

In some embodiments of the disclosure, the second ligand is selected from the following structure:

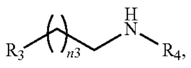

wherein $R_3$ is selected from amino group, carboxylic acid group, thiol group, phosphonic group, phosphooxy group or disulfide group; $R_4$ is selected from a group composed of the following structures:

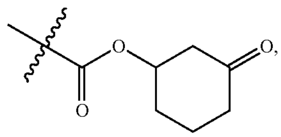,
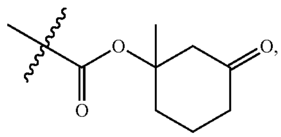,
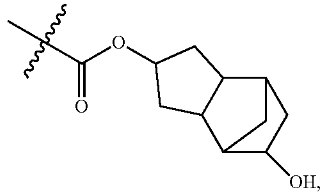,
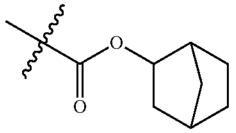 and 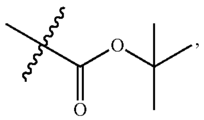, wherein, n3 is selected from any integer from 0 to 7, which can be 0, 1, 2, 3, 4, 5, 6, or 7.

The disclosure also provides a quantum dot light emitting device, including a functional layer, which includes a quantum dot light emitting layer in any of the above embodiments.

The quantum dot light emitting device can further include an anode and a cathode, and the functional layer is disposed between the anode and the cathode. The functional layer further includes a hole injection layer, a hole transport layer, an electron transport layer, and an electron injection layer.

Figure 8:
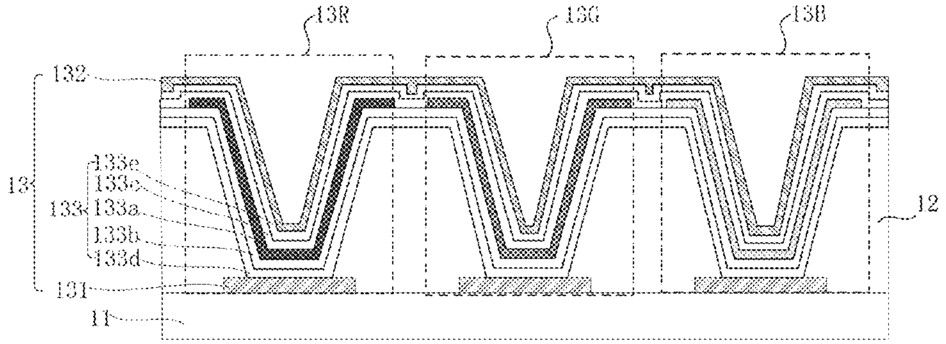
FIG. 8 is the structural diagram of the quantum dot light emitting device in the exemplary embodiment of the disclosure.

As shown in FIG. 8, in a specific embodiment of the disclosure, the quantum dot light emitting device can include the substrate 11 and the first electrode 131, the hole injection layer 133*d*, the hole transfer layer 133*b*, the quantum dot light emitting layer 133*a*, the electron transfer layer 133*c*, the electron injection layer 133*e* and the second electrode 132 disposed on one side of the substrate 11 in turn.

One of the first electrode 131 and the second electrode 132 is the anode and the other is the cathode. For example, the first electrode 131 may be the anode and the second electrode 132 may be the cathode. For example, the first electrode 131 may be the cathode and the second electrode 132 may be the anode.

The anode can include a conductor with high work function, such as a metal, a conductive metal oxide, or a combination thereof. The anode can include, for example, a metal such as nickel, platinum, vanadium, chromium, copper, zinc, or gold, or their alloys; a conductive metal oxide such as zinc oxide, indium oxide, tin oxide, indium tin oxide (ITO), indium zinc oxide (IZO), or fluorine doped tin oxide; or the combination of the metal and the conductive metal oxide such as ZnO and Al, or $SnO_2$ and Sb, but not limited to thereto.

The cathode may include a conductor with a lower work function than the anode, such as a metal, a conductive metal oxide, and/or a conductive polymer. The cathode can include, for example, the metal such as aluminum, magnesium, calcium, sodium, potassium, titanium, indium, yttrium, lithium, gadolinium, silver, tin, lead, cesium, barium, or their alloys; the multilayer structure such as LiF/Al, $Li_2O$/Al, Liq/Al, LiF/Ca, and $BaF_2$/Ca, but not limited to thereto.

The work function of the anode can be higher than that of the cathode, for example, the work function of the anode can be from about 4.5 eV to about 5.0 eV, and the work function of the cathode can be from about 4.0 eV to about 4.7 eV. Within this range, the work function of the anode can be, for example, about 4.6 eV to about 4.9 eV or about 4.6 eV to about 4.8 eV, and the work function of the cathode can be, for example, about 4.0 eV to about 4.6 eV or about 4.3 eV to about 4.6 eV.

The first electrode 131 and the second electrode 132 can be a transmission electrode, a partial-transmission partial-reflection electrode, or a reflection electrode. The transmission electrode or partial-transmission partial-reflection electrode can include a conductive oxide such as zinc oxide, indium oxide, tin oxide, indium tin oxide (ITO), indium zinc oxide (IZO), or a fluorine doped tin oxide, or a thin metal layer. The reflection electrode can include a reflective metal such as an opaque conductor such as aluminum (Al), silver (Ag), or gold (Au), and the first and second electrodes can be single-layer or multi-layer structure.

At least one of the first electrode 131 or the second electrode 132 can be connected to an auxiliary electrode. If connected to the auxiliary electrode, the resistance of the second electrode 132 can be reduced.

The hole transport layer 133*b* and hole injection layer 133*d* are disposed between the first electrode 131 and the quantum dot film layer 133*a*. The hole transport layer 133*b* is disposed near the quantum dot film layer 133*a* between the first electrode 131 and the quantum dot film layer 133*a*, and the hole injection layer 133*d* is disposed near the first electrode 131 between the first electrode 131 and the quantum dot film layer 133*a*. The hole injection layer 133*d* can promote the injection of holes from the first electrode, and the hole transport layer 133*b* can effectively transfer the injected holes to the quantum dot film layer 133*a*. The hole transport layer 133*b* and hole injection layer 144*d* may each have one or two or more layers, and in its broadest sense may include an electron barrier layer.

The hole transport layer 133*b* and hole injection layer 133*d* may each have a HOMO energy level between the work function of the first electrode 131 and the HOMO energy level of the quantum dot film layer 133*a*. For example, the work function of the first electrode 131, the HOMO level of the hole injection layer 133*d*, the HOMO level of the hole transport layer 133*b*, and the HOMO level of the quantum dot film layer 133*a* can gradually deepen, for example, in a stepped meaner.

The hole transport layer 133*b* can have a relatively deep HOMO level to match the HOMO level of the quantum dot film layer 133*a*. Therefore, the migration ratio of holes transferred from the hole transport layer 133*b* to the quantum dot layer can be improved.

The HOMO energy level of the hole transport layer 133*b* can be equal to the HOMO energy level of the quantum dot film layer 133*a* or smaller than the HOMO energy level of the quantum dot film layer 133*a* within a range of about 1.0 eV or less. For example, the difference between the HOMO energy levels of the hole transport layer 133*b* and the quantum dot film layer 133*a* can be about 0 eV to about 1.0 eV, within the range such as about 0.01 eV to about 0.8 eV, within the range such as about 0.01 eV to about 0.7 eV, within the range such as about 0.01 eV to about 0.5 eV, within the range such as about 0.01 eV to about 0.4 eV, such as about 0.01 eV to about 0.3 eV, such as about 0.01 eV to about 0.2 eV, such as about 0.01 eV to about 0.1 eV.

The HOMO energy level of the hole transport layer 133*b* can be, for example, greater than or equal to about 5.0 eV, within a range such as greater than or equal to about 5.2 eV, within a range such as greater than or equal to about 5.4 eV, within a range such as greater than or equal to about 5.6 eV, and within a range such as greater than or equal to about 5.8 eV.

For example, the HOMO energy level of the hole transport layer 133*b* can be from about 5.0 eV to about 7.0 eV, within the range such as about 5.2 eV to about 6.8 eV, within the range such as about 5.4 eV to about 6.8 eV, such as about 5.4 eV to about 6.7 eV, such as about 5.4 eV to about 6.5 eV, such as about 5.4 eV to about 6.3 eV, such as about 5.4 eV to about 6.2 eV, such as about 5.4 eV to about 6.1 eV, such as about 5.6 eV to about 7.0 eV, such as about 5.6 eV to about 6.8 eV, such as about 5.6 eV to about 5.6 eV 6.7 eV For example, from about 5.6 eV to about 6.5 eV, from about 5.6 eV to about 6.3 eV, from about 5.6 eV to about 6.2 eV, from about 5.6 eV to about 6.1 eV, from about 5.8 eV to about 7.0 eV, from about 5.8 eV to about 6.8 eV, from about 5.8 eV to about 6.7 eV, from about 5.8 eV to about 6.5 eV, from about 5.8 eV to about 6.3 eV, from about 5.8 eV to about 6.2 eV, from about 5.8 eV to about 6.1 eV.

The hole transport layer 133*b* and the hole injection layer 133*d* may include materials that meet energy levels without special restrictions, and may include, for example, at least one selected from the following: poly(9,9-dioctylfluorene-co-N-(4-butylphenyl)-diphenylamine) (TFB), poly(N,N'-bi-4-butylphenyl-N,N'-diphenyl) benzidine (poly TPD), polyarylamine (polyarylamine), poly(N-vinylcarbazole), poly (3,4-ethylenedioxythiophene) (PEDOT), poly (3,4-ethylenedioxythiophene):polystyrene sulronate (PEDOT:PSS), polyaniline, polypyrrole, N,N',N'-tetra(4-methoxyphenyl)-benzidine (TPD), 4,4'-bis[N-(1-naphthyl)-N-phenyl-amino] biphenyl(α-NPD), m-MTDATA (4,4',4"-tri[phenyl(m-methylphenyl)amino]triphenylamine), 4,4',4"-tri (N-carbazolyl)-triphenylamine (TCTA), 1,1-bis[(di-4-tolylamino) phenyl] cyclohexane (TAPC), p-type metal oxides (such as NiO, $WO_3$, $MoO_3$, etc.), carbon based materials such as graphene oxide, phthalocyanine compounds (such as copper phthalocyanine); N,N'-diphenyl-N,N'-bis-[4-(phenyl-m-methylphenyl amino)-phenyl]-biphenyl-4,4'-diamine (DNTPD), 4,4',4"-tri(3-methylphenylphenylamino) triphenylamine (m-MTDATA), 4,4',4"-tri(N,N-diphenylamino) triphenylamine (TDATA), 4,4',4"-tri {N-(2-naphthyl)-N-phenylamino}-triphenylamine (2-TNATA), poly(3,4-ethylenedioxythiothiophene)/poly (4-styrylsulfonate) (PEDOT/PSS) polyaniline/dodecylbenzenesulphonic acid (PANI/DBSA), polyaniline/camphorsulfonic acid (PANI/CSA), polyaniline/poly(4-phenylenesulfonat) (PANI/PSS), N,N'-bis (naphthalen-1-yl)-N,N'-diphenyl-benzidine (NPB), polyetherketone containing triphenylamine (TPAPEK), 4-isopropyl-4'-methyldiphenyliodiumtetra (pentafluorophenyl) borate and/or dipyrazino[2,3-f:2',3'-h] quinoline oxaline-2,3,6,7,10,11-hexacyanonitrile (HAT-CN), carbazole derivatives (such as N-phenylcarbazole and/or polyvinylcarbazole), fluorine derivatives, N,N'-bis(3-methylphenyl)-N,N'-diphenyl-[1,1-biphenyl]-4,4'-diamine (TPD), triphenylamine derivatives (such as 4,4',4"-tri(N-carbazolyl) triphenylamine (TCTA)), N,N'-bis (naphthalen-1-yl)-N,N'-diphenylbenzidine (NPB), 4,4'-cyclohexylidenebis[N,N-bis (4-methylphenyl) aniline] (TAPC), 4,4'-bis[N,N'-(3-methylamino)-3,3'-dimethylbiphenyl (HMTPD), 1,3-bis(N-carbazolyl) benzene (mCP) and their combinations, but not limited to thereto.

One or both of the hole transport layer and hole injection layer can be omitted.

One or more suitable methods (such as vacuum deposition, spin applying, tape casting, Langmuir-Blodget (LB) method, sputtering, inkjet printing, laser printing, and/or laser induced thermal imaging (LITI) method) can be used to form the hole transport layer 133*b* and hole injection layer 133*d*.

Quantum dots of different sizes in the light emitting layer can emit light of different colors and form subpixels of different colors, such as the first color subpixel 13G, the second color subpixel 13B, and the third color subpixel 12R.

The electron transfer layer 133*c* and the electron injection layer 133*e* are disposed between the second electrode 132 and the quantum dot film layer 133*a*. The electron transfer layer 133*c* is disposed near the quantum dot film layer 133*a* between the second electrode 132 and the quantum dot film layer 133*a*, and the electron injection layer 133*e* is disposed near the second electrode 132 between the second electrode 132 and the quantum dot film layer 133*a*. The electron injection layer 133*e* can promote the injection of electrons from the second electrode, and the electron transport layer 133*c* can effectively transfer the injected electrons to the quantum dot film layer 133*a*. The electron transport layer 133*c* and the electron injection layer 133*e* may each have one or two or more layers, and in its broadest sense may include a hole barrier layer.

For example, the electron injection layer 133*e* may contact with the second electrode 132.

For example, the electron transport layer 133*c* may contact with the quantum dot film layer 133*a*.

For example, the electron transport layer 133*c* and the electron injection layer 133*e* may contact with each other. One or both of the electron transport layer and the electron injection layer can be omitted.

For example, the LUMO energy levels of the second electrode 132, electron injection layer 133*e*, electron transport layer 133*c*, and quantum dot film layer 133*a* can gradually become shallower. For example, the LUMO level of the electron injection layer 133*e* can be shallower than the work function of the second electrode 132, and the LUMO level of the electron transfer layer 133*c* can be shallower than the LUMO level of the electron injection layer 133*e*, and the LUMO level of the quantum dot film layer 133*a* can be shallower than the LUMO level of the electron transfer layer 133*c*. That is, the work function of the second electrode 132, the LUMO energy level of the electron injection layer 133*e*, the LUMO energy level of the electron transfer layer 133*c*, and the LUMO energy level of the quantum dot film layer 133*a* may have a gradually decreasing, along one direction (cascading energy level).

The electron transport layer 133*c* may include a first inorganic nanoparticle. The first inorganic nanoparticle can be, for example, an oxide nanoparticle, and can be, for example, a metal oxide nanoparticle.

The first inorganic nanoparticle can be two-dimensional or three-dimensional nanoparticle with an average particle diameter of less than or equal to about 10 nm, within a range of less than or equal to about 8 nm, less than or equal to about 7 nm, less than or equal to about 5 nm, less than or equal to about 4 nm, or less than or equal to about 3.5 nm, or within a range of about 1 nm to about 10 nm, about 1 nm to about 9 nm, about 1 nm to about 8 nm, about 1 nm to about 7 nm, about 1 nm to about 5 nm, about 1 nm to about 4 nm Or about 1 nm to about 3.5 nm.

For example, the first inorganic nanoparticle can be a metal oxide nanoparticle, which include at least one of the following: zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), and barium (Ba).

As an example, the first inorganic nanoparticle may include a metal oxide nanoparticle containing zinc (Zn), and may include a metal oxide nanoparticle represented by $Zn_{1-x}Q_xO$ ($0 \le x < 0.5$). Here, Q refers to at least one metal different from Zn, such as magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof.

For example, Q can include magnesium (Mg).

For example, x can be within the range of $0.01 \le x \le 0.3$, for example, $0.01 \le x \le 0.2$.

The LUMO energy level of the electron transfer layer 16 can be a value between the LUMO energy level of quantum dot film layer 133*a* and the LUMO energy level of electron injection layer 17, and can be about 3.2 eV to about 4.8 eV, about 3.2 eV to about 4.6 eV, about 3.2 eV to about 4.5 eV, about 3.2 eV to about 4.3 eV, about 3.2 eV to about 4.1 eV, about 3.4 eV to about 4.1 eV, about 3.5 eV to about 4.6 eV, about 3.6 eV to about 4.6 eV, about 3.6 eV to about 4.3 eV, about 3.6 eV to about 4.1 eV, about 3.6 eV to about 3.9 eV, about 3.7 eV to about 4.6 eV, about 3.7 eV to about 4.3 eV, about 3.7 eV to about 4.1 eV, or about 3.7 eV to about 3.9 eV.

The thickness of the electron transport layer 133*c* can be greater than about 10 nm and less than or equal to about 80 nm, and within the range, greater than about 10 nm and less than or equal to about 70 nm, greater than about 10 nm and less than or equal to about 60 nm, greater than about 10 nm and less than or equal to about 50 nm, greater than about 10 nm and less than or equal to about 40 nm, or greater than about 10 nm and less than or equal to about 30 nm.

The LUMO energy level of the electron injection layer 133*e* can be between the work function of the second electrode 132 and the LUMO energy level of the electron transfer layer. For example, the difference between the work function of the second electrode 132 and the LUMO energy level of the electron injection layer 133*e* can be less than about 0.5 eV, about 0.001 eV to about 0.5 eV, about 0.001 eV to about 0.4 eV, or about 0.001 eV to about 0.3 eV. As an example, the difference between the LUMO energy level of the electron injection layer 133*e* and the LUMO energy level of the electron transfer layer can be less than about 0.5 eV, about 0.001 eV to about 0.5 eV, about 0.001 eV to about 0.4 eV, or about 0.001 eV to about 0.3 eV. Therefore, electrons can be easily injected from the second electrode 132 into the electron injection layer 133*e* to reduce the driving voltage of the quantum dot device, and electrons can be effectively transferred from the electron injection layer 133*e* to the electron transport layer to improve efficiency. The LUMO energy levels of the electron injection layer can be about 3.4 eV to about 4.8 eV, about 3.4 eV to about 4.6 eV, about 3.4 eV to about 4.5 eV, about 3.6 eV to about 4.8 eV, about 3.6 eV to about 4.6 eV, about 3.6 eV to about 4.5 eV, about 3.6 eV to about 4.3 eV, about 3.9 eV to about 4.8 eV, about 3.9 eV to about 4.6 eV, about 3.9 eV to about 4.5 eV, or about 3.9 eV to about 4.3 eV, within a range satisfying the aforementioned energy level.

The electron injection layer 133*e* can be thinner than the electron transport layer 133*c*. For example, the thickness of the electron injection layer 133*e* can be about 0.01 to about 0.8 times, about 0.01 to about 0.7 times, about 0.01 to about 0.5 times, about 0.1 to about 0.8 times, about 0.1 to about 0.7 times, or about 0.1 to about 0.5 times the thickness of the electron transfer layer 133*c*. The thickness of the electron injection layer 17 can be, for example, less than or equal to about 10 nm, less than or equal to about 7 nm, or less than or equal to about 5 nm. Within the range, the thickness of the electron injection layer 17 can be about 1 nm to about 10 nm, about 1 nm to about 8 nm, about 1 nm to about 7 nm, or about 1 nm to about 5 nm.

One or more suitable methods (such as vacuum deposition, spin applying, tape casting, Langmuir-Blodget (LB) method, sputtering, inkjet printing, laser printing, and/or laser induced thermal imaging (LITI) method) can be used to form the electron transport layer 133*c* and electron injection layer 133*e*.

In some embodiments of the disclosure, the quantum dot light emitting device can also be a photoluminescent quantum dot device containing a light emitting unit, and the quantum dot light emitting layer is disposed on one side of the light emitting unit.

Figure 9:
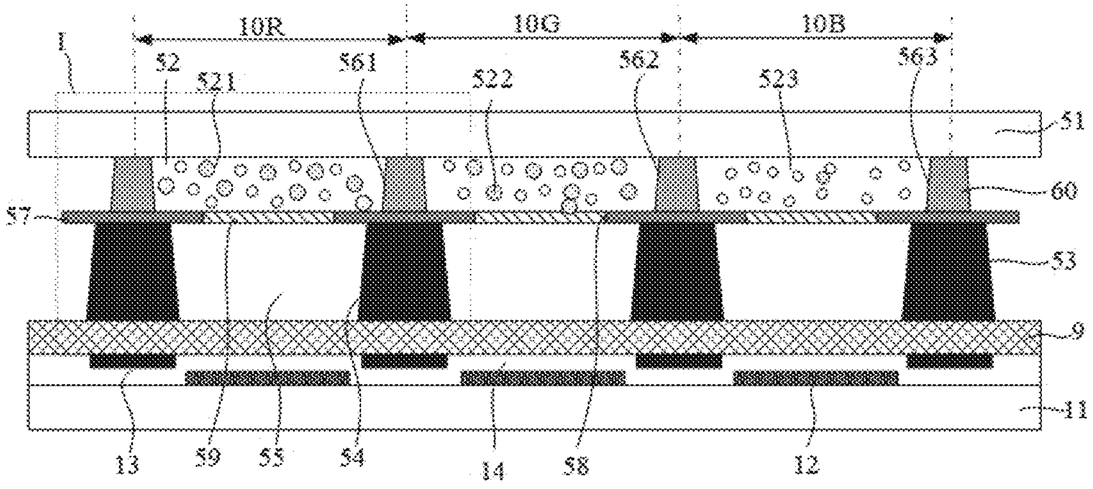
FIG. 9 is a structural diagram of a quantum dot light emitting device in another exemplary embodiment of the disclosure.

As shown in FIG. 9, the quantum dot light emitting device according to the embodiment of the disclosure can include a first substrate and a second substrate. The first substrate and the second substrate can be disposed opposite to each other, for example, the first substrate can be a substrate with components such as a light source, and the second substrate can be a substrate with components such as a color film.

The first substrate can include a first substrate 11 and multiple light emitting units 12 disposed on the first substrate 11.

The second substrate can include a second substrate 51, a quantum dot light emitting layer disposed on the second substrate 51, multiple extinction structures 53 located on one side of the quantum dot light emitting layer facing the first substrate, wherein a first channel 54 is formed between any two adjacent extinction structures 53, and multiple first optical structures 55 located on one side of the quantum dot light emitting layer facing the first substrate, wherein multiple first optical structures 55 are respectively located in the first channel 54 between any two adjacent extinction structures 53.

The quantum dot light emitting device can further include a filling material part 9 disposed between the first substrate and the second substrate.

In the embodiment of the disclosure, the refractive index of the material of filling material part 9 is greater than that of the material of the first optical structure 55, and the extinction structure 53 includes an absorbing material.

As shown in FIG. 9, the orthographic projections of a plurality of light emitting units 12 on the first substrate 11 at least partially overlap with the orthographic projections of a plurality of first optical structures 55 on the first substrate 11, and the orthographic projection of the quantum dot light emitting layer on the first substrate 11 overlaps at least partially with the orthographic projections of a plurality of first optical structures 55 on the first substrate 11, the orthographic projections of a plurality of first optical structures 55 on the first substrate 11 falls into the orthographic projection of the filler material unit 9 on the first substrate 11. The first substrate 11 and the second substrate 51 may be a rigid substrate or a flexible substrate, including but not limited to a glass substrate or a polyimide (PI) substrate.

In the embodiment of the disclosure, multiple light emitting units 12 may include multiple organic light emitting diodes or multiple inorganic light emitting diodes, such as Mini LEDs or Micro LEDs.

In the embodiment of the disclosure, the quantum dot light emitting device may include a plurality of subpixels I, such as an area surrounded by a dotted frame. Subpixel I can be a third color subpixel 10R for emitting light with a first wavelength range, a first color subpixel 10G for emitting light with a second wavelength range, and a second color subpixel 10B for emitting light with a third wavelength range. Each subpixel may include a subpixel opening, for example, the third color subpixel 10R may include a first subpixel opening 561, the first color subpixel 10G may include a second subpixel opening 562, and the second color subpixel 10B may include a third subpixel opening 563. The first color, second color, and third color can refer to green, blue, and red respectively. Of course, the quantum dot light emitting device can further include pixels for emitting other colors, such as pixels emitting yellow light, which are not specifically limited by the embodiments of the disclosure.

The quantum dot light emitting layer can include multiple quantum dot structures for emitting light of different colors, which include the first unit of the disclosure. If the quantum dot structure includes the quantum dot body and the first unit, the first unit is combined with the surface of the quantum dot body. For example, the third color subpixel 10R may include a first quantum dot structure 521 for emitting light with a first wavelength range, and the first color subpixel 10G may include a second quantum dot structure 522 for emitting light with a second wavelength range. Of course, the quantum dot light emitting layer can further include quantum dot structures for emitting light with other wavelength ranges, such as quantum dot structures that emit yellow light.

The second substrate can further include multiple light barrier structures 57 disposed on the second substrate 51, and the light barrier structures 57 is located between the layer where the extinction structure 53 is located and the layer where the quantum dot film layer 52 is located. For example, the light barrier structure 57 includes a light barrier material.

A second channel 58 is formed between any two adjacent light barrier structures 57, the orthographic projection of the second channel 58 on the second substrate 51 falls into the orthographic projection of the first channel 54 on the second substrate 51, and a plurality of first channels 54 and a plurality of second channels 58 are respectively connected to form a plurality of light inlet channels.

The second substrate can further include a plurality of quantum dot protection structures 59 disposed on the second substrate 51, a plurality of quantum dot protection structures 59 are located between the quantum dot light emitting layer 52 and the first optical structure 55, and the orthographic projections of the plurality of quantum dot protection structures 59 on the second substrate 51 are respectively located in the orthographic projections of the plurality of second channels 58 on the second substrate 51. In this way, multiple quantum dot protection structures 59 protect quantum dot structures located in each pixel opening.

The second substrate can further include a plurality of barrier structures 60 disposed on the second substrate 51, the plurality of barrier structures 60 are located between the second substrate 51 and the plurality of extinction structures 53, and the orthographic projections of the plurality of barrier structures 60 on the second substrate 51 are respectively located in the orthographic projections of the plurality of extinction structures 53 on the second substrate 51.

The above-mentioned pixel openings 561, 562 and 563 are located between any two adjacent barrier structures 60. The orthographic projection of each pixel opening 561, 562 and 563 on the first substrate 11 respectively covers the orthographic projections of a plurality of light input channels on the first substrate 11, and the orthographic projection of each pixel opening 561, 562 and 563 on the first substrate 11 respectively covers the orthographic projections of a plurality of light emitting units 12 on the first substrate 11.

The disclosure also provides a display apparatus, including the above quantum dot light emitting device. The display apparatus of the disclosure can be an electronic device such as a mobile phone, a tablet, a television, etc., and will not be listed here.

The following will provide a detailed explanation of the preparation method of the quantum dot light emitting layer of the disclosure, in conjunction with specific embodiments.

Example 1

1) Providing the first quantum dot body-first ligand solution

In this embodiment, the structure of the first ligand was

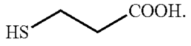

(11) The phase inversion agent of the first ligand-methanol was provided, and the pH was adjusted to 11-12 with a sodium hydroxide solution.

(12) The first quantum dot body solution was added to the phase inversion agent and stirred; subsequently, the equal volume of deionized water was added and stirred for 10 minutes, and centrifuged for cleaning. The acetone/methanol mixed solvent was centrifuged twice to obtain the first quantum dot body-first ligand mother solution.

The 0.5M concentration of HCl/MeOH solution was added to adjust the pH to 6.5-7.0, precipitate the first quantum dot body-first ligand, centrifuge and collect, dissolve in PGMEA, and prepare the 10 mg/mL first quantum dot body-first ligand solution.

2) Applying the first quantum dot body-first ligand solution on one side of the substrate to form the first quantum dot film layer The 10 mg/mL first quantum dot body-first ligand solution was applied to form the film with the thickness of 15 nm to 25 nm.

3) Providing the mixed solution of the second quantum dot body-second ligand solution and the photo-acid generator In this example, the structure of the second ligand was

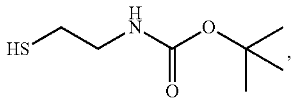

and the method was provided by referring to step 1) above. The 10 mg/mL second quantum dot body-second ligand solution was provided, in which the photo-acid generator (PAG) was added at the concentration of 0.5 mg/mL.

4) Applying the mixed solution of the second quantum dot body, second ligand, and the photo-acid generator on the side of the first quantum dot film layer far from the substrate to form the second quantum dot film layer The 10 mg/mL of the second quantum dot second ligand, 0.5 mg/mLPAG solution, was applied to form the film with the thickness of 15 nm to 25 nm.

Exposure and development process was performed. Under light conditions, the second ligand removed the protective group to form amino group, and the first quantum dot film layer and the second quantum dot film layer in the predetermined region (exposed region) cross-linked or formed the salt.

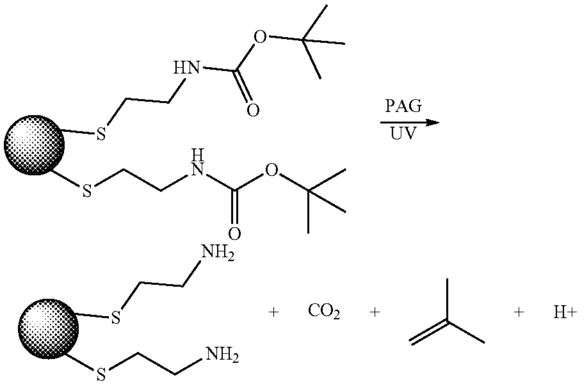

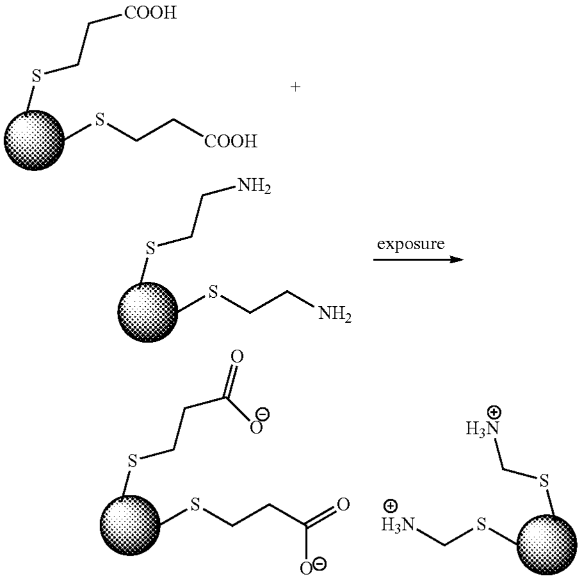

The material of the first quantum dot film layer in the non-predetermined region (non-exposed region) ionized and was dissolved, and the second quantum dot film layer was taken away.

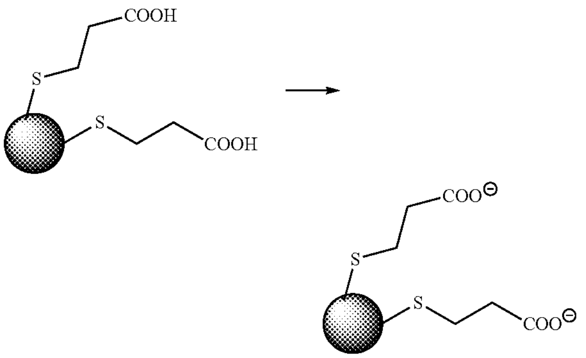

Example 2

1) Providing the first quantum dot body-first ligand solution

In this embodiment, the structure of the first ligand was

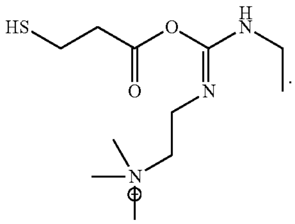 [SMILES: CCN/C(=N/CC[N+](C)(C)C)OC(=O)CCS]

(11) The solution of the first quantum dot body-first ligand matrix was provided, the structure of the first ligand matrix was

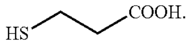

The method provided can refer to step (1) in Example 1;

(12) EDC (10 mg/mL, equal volume) was added to the first quantum dot body-first ligand matrix solution (10 mg/mL) and stirred at room temperature for 4 hours; precipitating with methanol. PGMEA dissolution/methanol precipitation was repeated 3 times, and finally dispersed in PGMEA to form the 10 mg/mL first quantum dot body-first ligand solution.

In this step, the first ligand matrix was activated by EDC to form the first ligand.

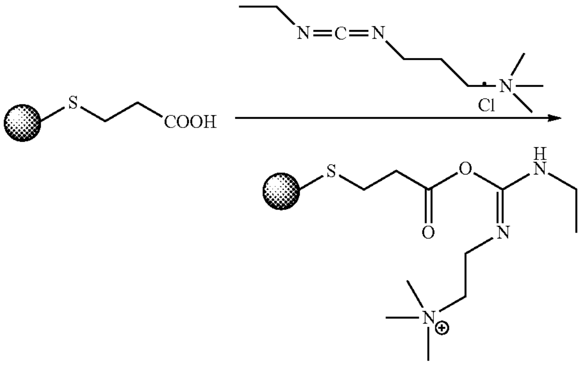

2) Applying the first quantum dot body-first ligand solution on one side of the substrate to form the first quantum dot film layer The 10 mg/mL first quantum dot body-first ligand solution was applied to form the film with the thickness of 15 nm to 25 nm.

3) Providing the mixed solution of the second quantum dot body-second ligand solution and the photo-acid generator In this example, the structure of the second ligand was

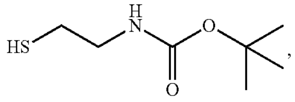

and the method was provided by referring to Example 1 above. The 10 mg/mL second quantum dot body-second ligand solution was provided, in which the photo-acid generator (PAG) was added at the concentration of 0.5 mg/mL.

4) Applying the mixed solution of the second quantum dot body, second ligand, and the photo-acid generator on the side of the first quantum dot film layer far from the substrate, forming the second quantum dot film layer The 10 mg/mL of the second quantum dot second ligand, 0.5 mg/mLPAG solution, was applied to form the film with the thickness of 15 nm to 25 nm.

Exposure and development process was performed to make the first quantum dot film layer and the second quantum dot film layer in the predetermined region (exposed region) cross-link.

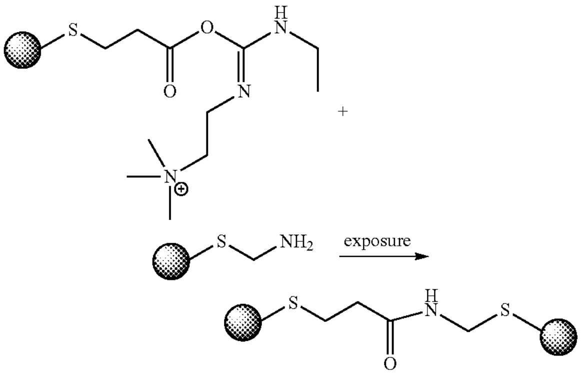

The material of the first quantum dot film layer in the non-predetermined region (non-exposed region) ionized and was dissolved, and the second quantum dot film layer was taken away.

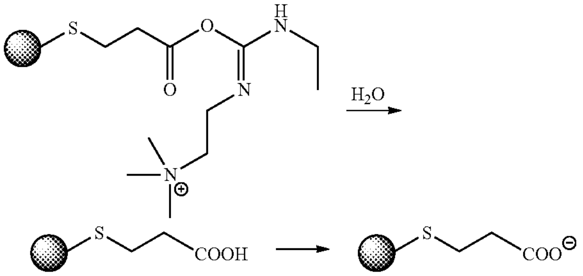

Example 3

1) Providing the first quantum dot body-first ligand solution

In this example, the structure of the first ligand was

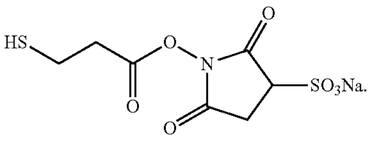

(11) The solution of the first quantum dot body-first ligand matrix was provided, and the structure of the first ligand matrix was

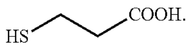

The method provided can refer to step (1) in Example 1;

(12) EDC/sulfo-NHS (all are 10 mg/mL, equal volume) was added to the first quantum dot body-first ligand matrix solution (10 mg/mL) and stirred at room temperature for 4 hours; precipitating with methanol. PGMEA dissolution/methanol precipitation was repeated 3 times, and finally dispersed in PGMEA to form the 10 mg/mL first quantum dot body-first ligand solution.

In this step, the first ligand matrix was activated by EDC and sulfo-NHS to form the first ligand.

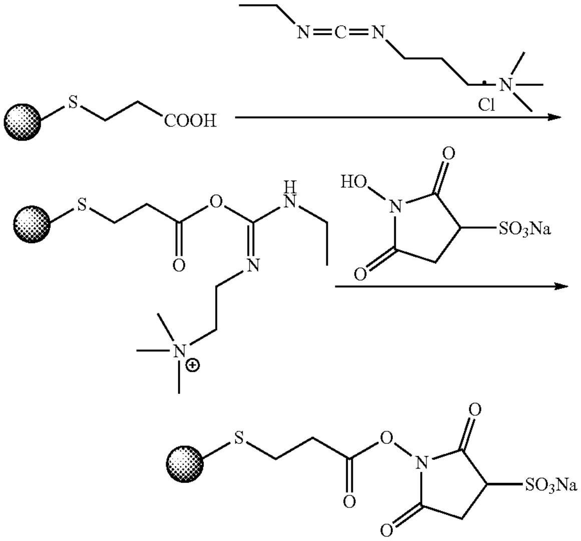

2) Applying the first quantum dot body-first ligand solution on one side of the substrate to form the first quantum dot film layer The 10 mg/mL first quantum dot body-first ligand solution was applying to form the film with the thickness of 15 nm to 25 nm.

3) Providing the mixed solution of the second quantum dot body-second ligand solution and the photo-acid generator In this example, the structure of the second ligand was

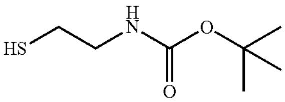

and the method was provided by referring to Example 1 above. The 10 mg/mL second quantum dot body-second ligand solution was provided, in which the photo-acid generator (PAG) was added at the concentration of 0.5 mg/mL.

4) Applying the mixed solution of the second quantum dot body, the second ligand, and the photo-acid generator on the side of the first quantum dot film layer far from the substrate, forming the second quantum dot film layer The 10 mg/mL of the second quantum dot second ligand, 0.5 mg/mLPAG solution, was applied to form the film with the thickness of 15 nm to 25 nm.

Exposure and development process was performed to make the first quantum dot film layer and the second quantum dot film layer in a predetermined region (exposed region) cross-link.

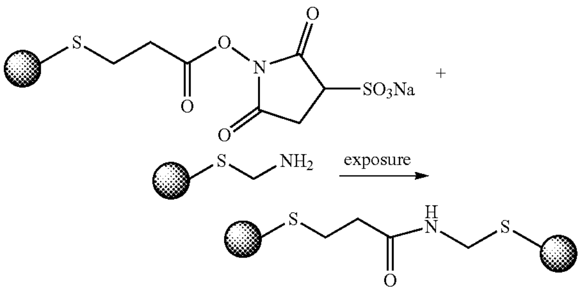

The material of the first quantum dot film layer in the non-predetermined region (non-exposed region) ionized and was dissolved, and the second quantum dot film layer was taken away.

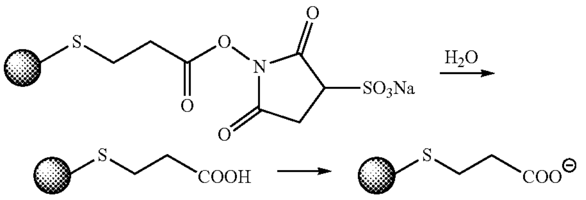

In this example, the activation of sulfo-NHS results in better ligand stability, higher water stability, favorable preservation, and water solubility.

In addition, the first quantum dot body-first ligand solution in the above examples, as well as the mixed solution of the second quantum dot body-second ligand solution and the photogenic acid agent, can be further mixed, and then applied to form the quantum dot film layer, which is further exposed and developed to form the quantum dot light emitting layer. The reactions occurring in the exposure and non-exposed regions can refer to the above embodiments.

It should be noted that although the various steps of the method in the disclosure are described in a specific order in the accompanying drawings, this does not require or imply that these steps must be executed in that specific order, or that all the steps shown must be executed to achieve the desired results. Additionally, or alternatively, the certain steps may be omitted, multiple steps may be combined into one step for execution, and/or one step may be decomposed into multiple steps for execution, all of which shall be considered as part of the disclosure.

It should be understood that this disclosure does not limit its application to the detailed structure and arrangement of the components proposed in this specification. This disclosure can have other embodiments and can be implemented and executed in multiple ways. The aforementioned deformation and modification forms fall within the scope of the disclosure. It should be understood that the disclosure and limitations of this specification extend to all alternative combinations of two or more individual features mentioned or apparent in the text and/or accompanying drawings. All these different combinations constitute multiple alternative aspects of this disclosure. The implementation methods of this specification illustrate the best-known methods for implementing the present disclosure, and will enable those skilled in the art to utilize the present disclosure.

What is claimed is:

1. A preparation method of quantum dot light emitting layer, comprising:

providing a substrate;

forming a quantum dot film layer on one side of the substrate, which comprises a first quantum dot body-first ligand and a second quantum dot body-second ligand;

exposing a predetermined region of the substrate to form a cross-linkage or a salt insoluble in a developer via a reaction between the first ligand and the second ligand in the predetermined region of the quantum dot film layer; and developing to remove the quantum dot film layer in the non-predetermined region of the substrate, and obtain the quantum dot light emitting layer;

wherein the first quantum dot body-first ligand is soluble in the developer;

the second quantum dot body-second ligand is insoluble in the developer after being exposed;

the first ligand of the first quantum dot body-first ligand comprises a cross-linkable group;

the second ligand of the second quantum dot body-second ligand comprises Z group, the structure of the Z group is-A-B, where A is imino group, and B is a protective group;

under light conditions, the Z group can remove the protective group to form an amino group under the action of a photo-acid generator, and a cross-linkage or a salt insoluble in the developer is formed via a reaction between the formed amino group and the cross-linkable group.

2. The preparation method of quantum dot light layer according to claim 1, wherein forming the quantum dot film layer on one side of the substrate, comprises:

providing a mixed solution of a first quantum dot body-first ligand solution, a second quantum dot body-second ligand solution, and the photo-acid generator; and applying the mixed solution of the first quantum dot body-first ligand solution, the second quantum dot body-second ligand solution, and the photo-acid generator on one side of the substrate to form the quantum dot film layer.

3. The preparation method of quantum dot light layer according to claim 1, wherein forming the quantum dot film layer on one side of the substrate, comprises:

forming at least one first quantum dot film layer and at least one second quantum dot film layer on one side of the substrate, the first quantum dot film layer and the second quantum dot film layer being stacked;

the material of the first quantum dot film layer comprises the first quantum dot body-first ligand, and the material of the second quantum dot film layer comprises the second quantum dot body-second ligand.

4. The preparation method of quantum dot light layer according to claim 3, wherein forming at least one first quantum dot film layer and at least one second quantum dot film layer on one side of the substrate, comprises:

providing a first quantum dot body-first ligand solution;

applying the first quantum dot body-first ligand solution on one side of the substrate to form the first quantum dot film layer;

providing a mixed solution of the second quantum dot body-second ligand solution and a photo-acid generator; and applying the mixed solution of the second quantum dot body-second ligand solution and the photo-acid generator on the side of the first quantum dot film layer far from the substrate to form the second quantum dot film layer.

5. The preparation method of quantum dot light layer according to claim 4, wherein providing the first quantum dot body-first ligand solution, comprises:

providing a first quantum dot body-first ligand matrix solution; and adding an activator to the first quantum dot body-first ligand matrix solution, activating the first ligand matrix in the first quantum dot body-first ligand matrix solution to the first ligand, and obtain the first quantum dot body-first ligand solution;

wherein the first ligand matrix comprises a cross-linkable matrix, which is selected from carboxylic acid group or sulfonic acid group;

the cross-linkable group is selected from

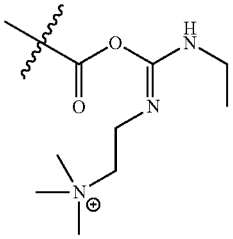
,
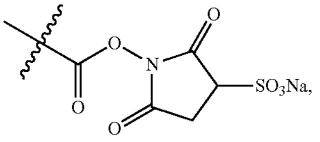

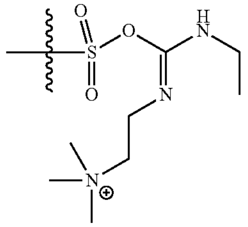
or

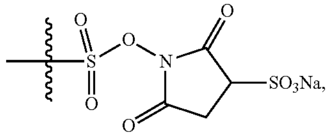

wherein ⌇ represents a chemical bond.

6. The preparation method of quantum dot light layer according to claim 1, wherein the cross-linkable group is selected from carboxylic acid group or sulfonic acid group.

7. The preparation method of quantum dot light layer according to claim 1, wherein the protective group is selected from a group consisting of the following structures:

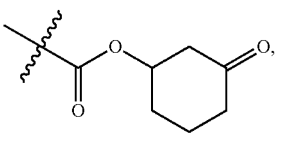
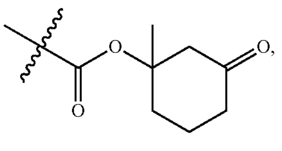

-continued

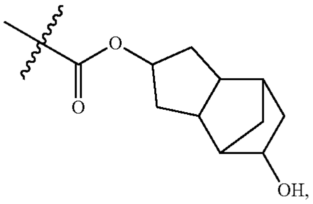

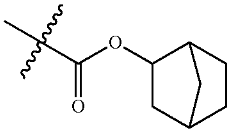
and
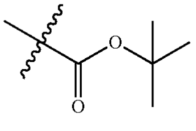

wherein ⌇ represents a chemical bond.

8. A quantum dot light emitting layer, wherein a material of the quantum dot light emitting layer comprises a first quantum dot body, a first ligand, a second quantum dot body, and a second ligand;

a coordinate bond is formed between the first ligand and the first quantum dot body, and a coordinate bond is formed between the second ligand and the second quantum dot body; and a cross-linkage or a salt insoluble in a developer is formed via a reaction between the first ligand and the second ligand;

wherein the quantum dot light emitting layer comprises at least one first light emitting layer and at least one second light emitting layer, and the first light emitting layer and the second light emitting layer are stacked;

a material of the first light emitting layer comprises the first quantum dot body and the first ligand, and a material of the second light emitting layer comprises the second quantum dot body and the second ligand.

9. The quantum dot light emitting layer according to claim 8, wherein the first ligand comprises a first coordination group and a cross-linkable group connected with each other, and a coordinate bond is formed between the first coordination group and the first quantum dot body;

the second ligand comprises a second coordination group and amino group connected with each other, and a coordinate bond is formed between the second coordination group and the second quantum dot body; and a cross-linkage or a salt insoluble in the developer is formed via a reaction between the cross-linkable group and the amino group in the second ligand.

10. The quantum dot light emitting layer according to claim 9, wherein the cross-linkable group is selected from carboxylic acid group, sulfonic acid group,

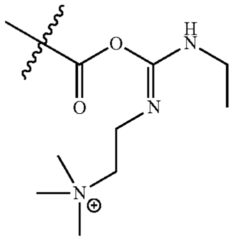
,
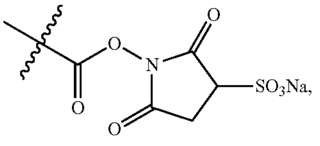

-continued

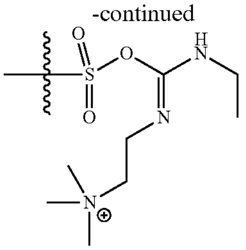

or

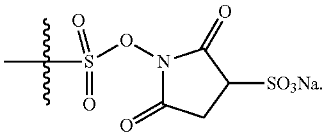

11. The quantum dot light emitting layer according to claim 9, wherein the material of the quantum dot light emitting layer comprises the following structure:

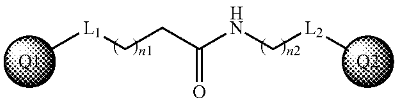

or

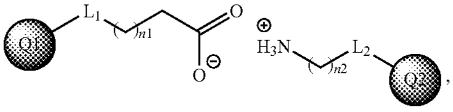

wherein Q1 is the first quantum dot body, Q2 is the second quantum dot body; $L_1$ is a first coordination group that forms a coordinate bond with the first quantum dot body; $L_2$ is a second coordination group that forms a coordinate bond with the second quantum dot body; n1 is selected from any integer from 1 to 7; n2 is selected from any integer from 0 to 8.

12. A quantum dot light emitting device, comprises a functional layer, and the functional layer comprises the quantum dot light emitting layer according to claim 8.

13. A display device comprising a quantum dot light emitting device according to claim 12.

14. A quantum dot mixture, comprises a first quantum dot body, a first ligand, a second quantum dot body, and a second ligand;

the first ligand comprises a first coordination group and a cross-linkable group connected with each other, and a coordinate bond is formed between the first coordination group and the first quantum dot body;

the second ligand comprises a second coordination group and Z group connected with each other, and a coordinate bond is formed between the second coordination group and the second quantum dot body; the structure of the Z group is-A-B, where A is imino group and B is a protective group;

wherein, the first ligand can ionize in an alkaline solution;

under light conditions, the Z group can remove the protective group to form an amino group under the action of a photo-acid generator;

the cross-linkable group can crosslink with the amino group formed by removing the protective group from the Z group or form a salt insoluble in a developer;

or the cross-linkable group activated by an activator, can crosslink with the amino group formed by removing the protective group from the Z group or form a salt insoluble in the developer.

15. The quantum dot mixture according to claim 14, wherein the cross-linkable group is selected from a carboxylic acid group or a sulfonic acid group; and the activator is selected from one or two of 1-ethyl-(3-dimethylaminopropyl) carbidiimide and N-hydroxythiosuccinimide.

16. The quantum dot mixture according to claim 14, wherein the protective group is selected from a group consisting of the following structures:

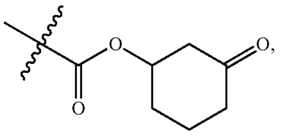

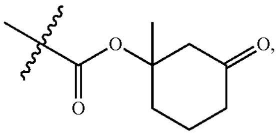

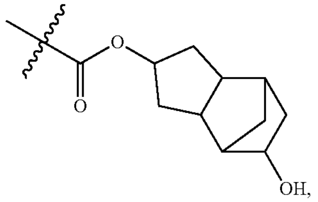

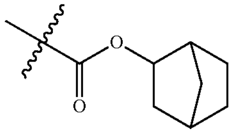

and

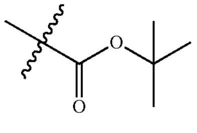

wherein  represents a chemical bond.

17. The quantum dot mixture according to claim 14, wherein the first ligand is selected from a group composed of the following structures:

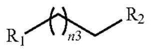

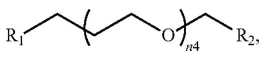

wherein $R_1$ is selected from amino group, carboxylic acid group, thiol group, phosphonic group, phosphooxy group or disulfide group; $R_2$ is selected from carboxylic acid group or sulfonic acid group; n3 is selected from any integer from 1 to 7; n4 is selected from any integer from 1 to 100.

18. The quantum dot mixture according to claim 14, wherein the second ligand is selected from the following structure:

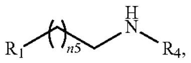

wherein $R_3$ is selected from amino group, carboxylic acid group, thiol group, phosphonic group, phosphooxy group or disulfide group; $R_4$ is selected from a group composed of the following structures:

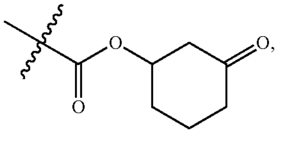

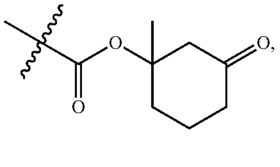

-continued
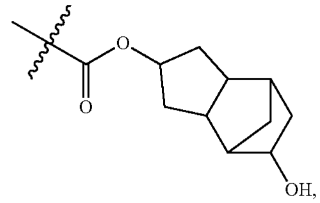
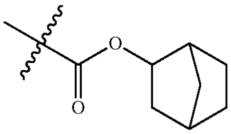
and
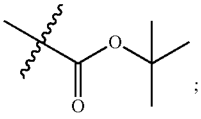
;
n5 is selected from any integer from 0 to 7.
* * * * *